United States Patent
Kothari et al.

(10) Patent No.: US 8,058,549 B2
(45) Date of Patent: Nov. 15, 2011

(54) PHOTOVOLTAIC DEVICES WITH INTEGRATED COLOR INTERFEROMETRIC FILM STACKS

(75) Inventors: Manish Kothari, Cupertino, CA (US); Gang Xu, Cupertino, CA (US); Kasra Khazeni, San Jose, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 419 days.

(21) Appl. No.: 11/966,850

(22) Filed: Dec. 28, 2007

(65) Prior Publication Data
US 2009/0101192 A1   Apr. 23, 2009

Related U.S. Application Data

(60) Provisional application No. 60/999,566, filed on Oct. 19, 2007.

(51) Int. Cl.
*H01L 31/0232* (2006.01)
*H01L 31/052* (2006.01)

(52) U.S. Cl. ........ 136/257; 136/252; 136/246; 136/244; 438/70

(58) Field of Classification Search .......... 136/252–265; 438/65
See application file for complete search history.

(56) References Cited

U.S. PATENT DOCUMENTS

| | | | |
|---|---|---|---|
| 2,534,846 A | 12/1950 | Ambrose et al. |
| 2,590,906 A | 4/1952 | Tripp |
| 2,677,714 A | 5/1954 | Auwarter |
| 2,700,919 A | 2/1955 | Boone |
| 3,247,392 A | 4/1966 | Thelen |
| 3,679,313 A | 7/1972 | Rosenberg |
| 3,728,030 A | 4/1973 | Hawes |
| 3,886,310 A | 5/1975 | Guldberg |
| 3,955,190 A | 5/1976 | Teraishi |
| 3,955,880 A | 5/1976 | Lierke |
| 4,099,854 A | 7/1978 | Decker et al. |
| 4,116,718 A | 9/1978 | Yerkes et al. |
| 4,200,472 A | 4/1980 | Chappell et al. |
| 4,282,862 A | 8/1981 | Soleau |
| 4,357,486 A | 11/1982 | Blieden et al. |
| 4,377,324 A | 3/1983 | Durand |

(Continued)

FOREIGN PATENT DOCUMENTS

DE   10329917   2/2005

(Continued)

OTHER PUBLICATIONS

Nakagawa et al., Wide-Field-of-View Narrow-Band Spectral Filters Based on Photonic Crystal Nanocavities, Optical Society of America, Optics Letters, vol. 27, No. 3, pp. 191-193, 2002.*

(Continued)

*Primary Examiner* — Jennifer K. Michener
*Assistant Examiner* — Jayne Mershon
(74) *Attorney, Agent, or Firm* — Knobbe Martens Olson & Bear LLP

(57) ABSTRACT

Color photovoltaic (PV) devices formed using interferometric stacks tuned to reflect color covering the front side or back side of a PV cell, device, panel, or array are disclosed. Interferometric stacks covering PV devices include interferometric modulators (IMODs), or dichroic pair stacks. Such devices can be configured to reflect enough light of select wavelengths so as to impart a color, while transmitting enough light to the PV active material so as to generate useful electricity.

31 Claims, 16 Drawing Sheets

U.S. PATENT DOCUMENTS

| | | | |
|---|---|---|---|
| 4,400,577 A | 8/1983 | Spear |
| 4,403,248 A | 9/1983 | Te Velde |
| 4,421,381 A | 12/1983 | Ueda et al. |
| 4,441,789 A | 4/1984 | Pohlack |
| 4,441,791 A | 4/1984 | Hornbeck |
| 4,459,182 A | 7/1984 | Te Velde |
| 4,497,974 A | 2/1985 | Deckman et al. |
| 4,498,953 A | 2/1985 | Cook et al. |
| 4,519,676 A | 5/1985 | te Velde |
| 4,560,435 A | 12/1985 | Brown et al. |
| 4,633,031 A | 12/1986 | Todorof |
| 4,655,554 A | 4/1987 | Armitage |
| 4,688,068 A | 8/1987 | Chaffin et al. |
| 4,779,959 A | 10/1988 | Saunders |
| 4,786,128 A | 11/1988 | Birnbach |
| 4,859,060 A | 8/1989 | Katagiri et al. |
| 4,925,259 A | 5/1990 | Emmett |
| 4,954,789 A | 9/1990 | Sampsell |
| 4,956,619 A | 9/1990 | Hornbeck |
| 4,973,131 A | 11/1990 | Carnes |
| 4,982,184 A | 1/1991 | Kirkwood |
| 5,022,745 A | 6/1991 | Zahowski et al. |
| 5,028,939 A | 7/1991 | Hornbeck et al. |
| 5,062,689 A | 11/1991 | Koehler |
| 5,091,983 A | 2/1992 | Lukosz |
| 5,096,279 A | 3/1992 | Hornbeck et al. |
| 5,110,370 A | 5/1992 | Vogeli et al. |
| 5,170,283 A | 12/1992 | O'Brien et al. |
| 5,261,970 A | 11/1993 | Landis et al. |
| 5,315,370 A | 5/1994 | Bulow |
| 5,356,488 A | 10/1994 | Hezel |
| 5,381,232 A | 1/1995 | Van Wijk |
| 5,401,983 A | 3/1995 | Jokerst |
| 5,452,138 A | 9/1995 | Mignardi et al. |
| 5,471,341 A | 11/1995 | Warde et al. |
| 5,500,761 A | 3/1996 | Goossen et al. |
| 5,526,172 A | 6/1996 | Kanack |
| 5,550,373 A | 8/1996 | Cole et al. |
| 5,559,358 A | 9/1996 | Burns et al. |
| 5,561,523 A | 10/1996 | Blomberg et al. |
| 5,578,140 A | 11/1996 | Yogev et al. |
| 5,597,736 A | 1/1997 | Sampsell |
| 5,600,383 A | 2/1997 | Hornbeck |
| 5,636,052 A | 6/1997 | Arney et al. |
| 5,646,729 A | 7/1997 | Koskinen et al. |
| 5,646,768 A | 7/1997 | Kaeiyama |
| 5,661,592 A | 8/1997 | Bornstein et al. |
| 5,665,997 A | 9/1997 | Weaver et al. |
| 5,699,181 A | 12/1997 | Choi |
| 5,710,656 A | 1/1998 | Goosen |
| 5,719,068 A | 2/1998 | Suzawa et al. |
| 5,720,827 A | 2/1998 | Simmons |
| 5,726,805 A | 3/1998 | Kaushik et al. |
| 5,734,177 A | 3/1998 | Sakamoto |
| 5,771,116 A | 6/1998 | Miller et al. |
| 5,782,995 A | 7/1998 | Nanya et al. |
| 5,786,927 A | 7/1998 | Greywall et al. |
| 5,808,781 A | 9/1998 | Arney et al. |
| 5,818,095 A | 10/1998 | Sampsell |
| 5,825,528 A | 10/1998 | Goosen |
| 5,835,255 A | 11/1998 | Miles |
| 5,838,484 A | 11/1998 | Goosen et al. |
| 5,867,302 A | 2/1999 | Fleming |
| 5,870,221 A | 2/1999 | Goossen |
| 5,886,688 A | 3/1999 | Fifield et al. |
| 5,907,426 A | 5/1999 | Kato et al. |
| 5,914,804 A | 6/1999 | Goossen |
| 5,920,418 A | 7/1999 | Shiono et al. |
| 5,961,848 A | 10/1999 | Jacquet et al. |
| 6,008,449 A | 12/1999 | Cole |
| 6,021,007 A | 2/2000 | Murtha |
| 6,028,689 A | 2/2000 | Michalicek et al. |
| 6,031,653 A | 2/2000 | Wang |
| 6,040,937 A | 3/2000 | Miles |
| 6,046,659 A | 4/2000 | Loo et al. |
| 6,055,090 A | 4/2000 | Miles |
| 6,097,145 A | 8/2000 | Kastalsky et al. |
| 6,100,861 A | 8/2000 | Cohen et al. |
| 6,123,431 A | 9/2000 | Teragaki et al. |
| 6,124,851 A | 9/2000 | Jacobsen |
| 6,242,932 B1 | 6/2001 | Hembree |
| 6,262,697 B1 | 7/2001 | Stephenson |
| 6,300,558 B1 * | 10/2001 | Takamoto et al. ............ 136/262 |
| 6,301,000 B1 | 10/2001 | Johnson |
| 6,323,415 B1 | 11/2001 | Uematsu et al. |
| 6,323,923 B1 | 11/2001 | Hoshino et al. |
| 6,323,987 B1 | 11/2001 | Rinaudo et al. |
| 6,327,071 B1 | 12/2001 | Kimura |
| 6,335,235 B1 | 1/2002 | Bhekta et al. |
| 6,351,329 B1 | 2/2002 | Greywall |
| 6,356,378 B1 | 3/2002 | Huibers |
| 6,377,233 B2 | 4/2002 | Colgan et al. |
| 6,381,022 B1 | 4/2002 | Zavracky |
| 6,384,952 B1 | 5/2002 | Clark et al. |
| 6,400,738 B1 | 6/2002 | Tucker et al. |
| 6,433,917 B1 | 8/2002 | Mei et al. |
| 6,438,282 B1 | 8/2002 | Takeda et al. |
| 6,452,712 B2 | 9/2002 | Atobe et al. |
| 6,466,354 B1 | 10/2002 | Gudeman |
| 6,518,944 B1 | 2/2003 | Doane et al. |
| 6,519,073 B1 | 2/2003 | Goossen |
| 6,556,338 B2 | 4/2003 | Han et al. |
| 6,574,033 B1 | 6/2003 | Chui et al. |
| 6,597,490 B2 | 7/2003 | Tayebati |
| 6,608,268 B1 | 8/2003 | Goldsmith |
| 6,630,786 B2 | 10/2003 | Cummings et al. |
| 6,632,698 B2 | 10/2003 | Ives |
| 6,650,455 B2 | 11/2003 | Miles |
| 6,657,832 B2 | 12/2003 | Williams et al. |
| 6,661,561 B2 | 12/2003 | Fitzpatrick et al. |
| 6,674,562 B1 | 1/2004 | Miles |
| 6,680,792 B2 | 1/2004 | Miles |
| 6,698,295 B1 | 3/2004 | Sherrer |
| 6,710,908 B2 | 3/2004 | Miles et al. |
| 6,738,194 B1 | 5/2004 | Ramirez et al. |
| 6,741,377 B2 | 5/2004 | Miles |
| 6,747,800 B1 | 6/2004 | Lin |
| 6,768,555 B2 | 7/2004 | Chen |
| 6,794,119 B2 | 9/2004 | Miles |
| 6,813,059 B2 | 11/2004 | Hunter et al. |
| 6,822,157 B2 | 11/2004 | Fujioka |
| 6,822,798 B2 | 11/2004 | Wu et al. |
| 6,836,366 B1 | 12/2004 | Flanders et al. |
| 6,841,081 B2 | 1/2005 | Chang et al. |
| 6,844,959 B2 | 1/2005 | Huibers et al. |
| 6,849,471 B2 | 2/2005 | Patel et al. |
| 6,861,277 B1 | 3/2005 | Monroe et al. |
| 6,862,127 B1 | 3/2005 | Ishii |
| 6,867,896 B2 | 3/2005 | Miles |
| 6,870,654 B2 | 3/2005 | Lin et al. |
| 6,882,458 B2 | 4/2005 | Lin et al. |
| 6,882,461 B1 | 4/2005 | Tsai et al. |
| 6,891,869 B2 | 5/2005 | Augusto |
| 6,912,022 B2 | 6/2005 | Lin et al. |
| 6,913,942 B2 | 7/2005 | Patel et al. |
| 6,940,630 B2 | 9/2005 | Xie |
| 6,947,200 B2 | 9/2005 | Huibers |
| 6,952,303 B2 | 10/2005 | Lin et al. |
| 6,958,847 B2 | 10/2005 | Lin |
| 6,960,305 B2 | 11/2005 | Doan et al. |
| 6,970,155 B2 | 11/2005 | Cabrera |
| 6,980,350 B2 | 12/2005 | Hung et al. |
| 6,982,820 B2 | 1/2006 | Tsai |
| 6,999,236 B2 | 2/2006 | Lin et al. |
| 7,002,726 B2 | 2/2006 | Patel et al. |
| 7,006,272 B2 | 2/2006 | Tsai |
| 7,009,754 B2 | 3/2006 | Huibers |
| 7,027,204 B2 | 4/2006 | Trisnadi et al. |
| 7,034,981 B2 | 4/2006 | Makigaki |
| 7,046,422 B2 | 5/2006 | Kimura et al. |
| 7,072,093 B2 | 7/2006 | Piehl et al. |
| 7,113,339 B2 | 9/2006 | Taguchi et al. |
| 7,119,945 B2 | 10/2006 | Kothari et al. |
| 7,123,216 B1 | 10/2006 | Miles |
| 7,126,738 B2 | 10/2006 | Miles |
| 7,130,104 B2 | 10/2006 | Cummings |
| 7,184,195 B2 | 2/2007 | Yang |

| Patent | Date | Inventor | Ref |
|---|---|---|---|
| 7,184,202 B2 | 2/2007 | Miles et al. | |
| 7,187,489 B2 * | 3/2007 | Miles | 359/290 |
| 7,198,973 B2 | 4/2007 | Lin et al. | |
| 7,218,438 B2 | 5/2007 | Przybyla et al. | |
| 7,221,495 B2 | 5/2007 | Miles et al. | |
| 7,236,284 B2 | 6/2007 | Miles | |
| 7,245,285 B2 | 7/2007 | Yeh et al. | |
| 7,289,259 B2 | 10/2007 | Chui et al. | |
| 7,302,157 B2 | 11/2007 | Chui | |
| 7,321,456 B2 | 1/2008 | Cummings | |
| 7,321,457 B2 | 1/2008 | Heald | |
| 7,327,510 B2 | 2/2008 | Cummings et al. | |
| 7,372,613 B2 | 5/2008 | Chui et al. | |
| 7,372,619 B2 | 5/2008 | Miles | |
| 7,385,744 B2 | 6/2008 | Kogut et al. | |
| 7,385,748 B2 * | 6/2008 | Miles | 359/245 |
| 7,385,762 B2 | 6/2008 | Cummings | |
| 7,400,488 B2 | 7/2008 | Lynch et al. | |
| 7,405,852 B2 | 7/2008 | Brosnihan et al. | |
| 7,417,746 B2 | 8/2008 | Lin et al. | |
| 7,420,725 B2 | 9/2008 | Kothari | |
| 7,436,573 B2 | 10/2008 | Doan et al. | |
| 7,459,402 B2 | 12/2008 | Doan et al. | |
| 7,460,291 B2 | 12/2008 | Sampsell et al. | |
| 7,460,292 B2 | 12/2008 | Chou | |
| 7,476,327 B2 | 1/2009 | Tung et al. | |
| 7,477,440 B1 | 1/2009 | Huang et al. | |
| 7,492,503 B2 | 2/2009 | Chui | |
| 7,508,566 B2 | 3/2009 | Feenstra et al. | |
| 7,515,327 B2 | 4/2009 | Cummings | |
| 7,527,995 B2 | 5/2009 | Sampsell | |
| 7,532,377 B2 | 5/2009 | Miles | |
| 7,535,621 B2 | 5/2009 | Chiang | |
| 7,542,198 B2 | 6/2009 | Kothari | |
| 7,550,794 B2 | 6/2009 | Miles et al. | |
| 7,550,810 B2 | 6/2009 | Mignard et al. | |
| 7,554,711 B2 | 6/2009 | Miles | |
| 7,554,714 B2 | 6/2009 | Chui et al. | |
| 7,561,321 B2 | 7/2009 | Heald | |
| 7,564,612 B2 | 7/2009 | Chui | |
| 7,566,664 B2 | 7/2009 | Yan et al. | |
| 7,567,373 B2 | 7/2009 | Chui et al. | |
| 7,569,488 B2 | 8/2009 | Rafanan | |
| 7,612,932 B2 | 11/2009 | Chui et al. | |
| 7,612,933 B2 | 11/2009 | Djordjev | |
| 7,629,197 B2 | 12/2009 | Luo et al. | |
| 7,630,119 B2 | 12/2009 | Tung et al. | |
| 7,630,121 B2 | 12/2009 | Endisch et al. | |
| 7,643,199 B2 | 1/2010 | Lan | |
| 7,643,202 B2 | 1/2010 | Sasagawa | |
| 7,649,671 B2 | 1/2010 | Kothari et al. | |
| 7,663,794 B2 | 2/2010 | Cummings | |
| 7,672,035 B2 | 3/2010 | Sampsell et al. | |
| 7,692,844 B2 | 4/2010 | Miles | |
| 7,701,029 B2 * | 4/2010 | Mabuchi | 257/462 |
| 7,704,772 B2 | 4/2010 | Tung et al. | |
| 7,715,079 B2 | 5/2010 | Kogut et al. | |
| 7,715,085 B2 | 5/2010 | Sasagawa | |
| 7,719,500 B2 * | 5/2010 | Chui | 345/84 |
| 7,738,157 B2 | 6/2010 | Miles | |
| 7,742,220 B2 | 6/2010 | Kogut et al. | |
| 7,773,286 B2 | 8/2010 | Mignard | |
| 7,782,517 B2 | 8/2010 | Griffiths et al. | |
| 7,782,523 B2 | 8/2010 | Ishii | |
| 7,787,173 B2 | 8/2010 | Chui | |
| 7,804,023 B2 | 9/2010 | Wong et al. | |
| 7,813,029 B2 | 10/2010 | Kothari et al. | |
| 7,852,544 B2 | 12/2010 | Sampsell | |
| 7,898,722 B2 | 3/2011 | Miles | |
| 2001/0003487 A1 | 6/2001 | Miles | |
| 2001/0006066 A1 | 7/2001 | Cherney et al. | |
| 2001/0028503 A1 | 10/2001 | Flanders et al. | |
| 2001/0043171 A1 | 11/2001 | Van Gorkom et al. | |
| 2002/0024711 A1 | 2/2002 | Miles | |
| 2002/0054424 A1 | 5/2002 | Miles | |
| 2002/0070931 A1 | 6/2002 | Ishikawa | |
| 2002/0075555 A1 | 6/2002 | Miles | |
| 2002/0126364 A1 | 9/2002 | Miles | |
| 2002/0146200 A1 | 10/2002 | Kudrle et al. | |
| 2002/0149828 A1 | 10/2002 | Miles | |
| 2002/0149834 A1 | 10/2002 | Mei et al. | |
| 2002/0154422 A1 | 10/2002 | Sniegowski et al. | |
| 2002/0197761 A1 | 12/2002 | Patel et al. | |
| 2003/0006730 A1 | 1/2003 | Tachibana | |
| 2003/0011864 A1 | 1/2003 | Flanders | |
| 2003/0016428 A1 | 1/2003 | Kato et al. | |
| 2003/0035196 A1 | 2/2003 | Walker | |
| 2003/0043157 A1 | 3/2003 | Miles | |
| 2003/0053078 A1 | 3/2003 | Missey et al. | |
| 2003/0119221 A1 | 6/2003 | Cunningham et al. | |
| 2003/0123125 A1 | 7/2003 | Little | |
| 2003/0138669 A1 | 7/2003 | Kojima et al. | |
| 2003/0173504 A1 | 9/2003 | Cole et al. | |
| 2003/0202265 A1 | 10/2003 | Reboa et al. | |
| 2003/0202266 A1 | 10/2003 | Ring et al. | |
| 2003/0213514 A1 * | 11/2003 | Ortabasi | 136/246 |
| 2004/0008396 A1 | 1/2004 | Stappaerts | |
| 2004/0008438 A1 | 1/2004 | Sato | |
| 2004/0027671 A1 | 2/2004 | Wu et al. | |
| 2004/0027701 A1 | 2/2004 | Ishikawa | |
| 2004/0043552 A1 | 3/2004 | Strumpell et al. | |
| 2004/0058532 A1 | 3/2004 | Miles et al. | |
| 2004/0066477 A1 | 4/2004 | Morimoto et al. | |
| 2004/0075967 A1 | 4/2004 | Lynch et al. | |
| 2004/0076802 A1 | 4/2004 | Tompkin et al. | |
| 2004/0080035 A1 | 4/2004 | Delapierre | |
| 2004/0100594 A1 | 5/2004 | Huibers et al. | |
| 2004/0100677 A1 | 5/2004 | Huibers et al. | |
| 2004/0125281 A1 | 7/2004 | Lin et al. | |
| 2004/0125282 A1 | 7/2004 | Lin et al. | |
| 2004/0145811 A1 | 7/2004 | Lin et al. | |
| 2004/0147198 A1 | 7/2004 | Lin et al. | |
| 2004/0175577 A1 | 9/2004 | Lin et al. | |
| 2004/0184134 A1 | 9/2004 | Makigaki | |
| 2004/0188599 A1 | 9/2004 | Viktorovitch et al. | |
| 2004/0200520 A1 | 10/2004 | Mulligan et al. | |
| 2004/0207897 A1 | 10/2004 | Lin | |
| 2004/0209195 A1 | 10/2004 | Lin | |
| 2004/0217264 A1 | 11/2004 | Wood et al. | |
| 2004/0217919 A1 | 11/2004 | Piehl et al. | |
| 2004/0218251 A1 | 11/2004 | Piehl et al. | |
| 2004/0259010 A1 | 12/2004 | Kanbe | |
| 2005/0002082 A1 | 1/2005 | Miles | |
| 2005/0003667 A1 | 1/2005 | Lin et al. | |
| 2005/0024557 A1 | 2/2005 | Lin | |
| 2005/0035699 A1 | 2/2005 | Tsai | |
| 2005/0036095 A1 | 2/2005 | Yeh et al. | |
| 2005/0046919 A1 | 3/2005 | Taguchi et al. | |
| 2005/0046922 A1 | 3/2005 | Lin et al. | |
| 2005/0046948 A1 | 3/2005 | Lin | |
| 2005/0068627 A1 | 3/2005 | Nakamura et al. | |
| 2005/0078348 A1 | 4/2005 | Lin | |
| 2005/0117190 A1 | 6/2005 | Iwauchi et al. | |
| 2005/0117623 A1 | 6/2005 | Shchukin et al. | |
| 2005/0128543 A1 | 6/2005 | Phillips et al. | |
| 2005/0133761 A1 | 6/2005 | Thielemans | |
| 2005/0168849 A1 | 8/2005 | Lin | |
| 2005/0179378 A1 | 8/2005 | Oooka et al. | |
| 2005/0195462 A1 | 9/2005 | Lin | |
| 2005/0225686 A1 | 10/2005 | Brummack et al. | |
| 2005/0275930 A1 | 12/2005 | Patel et al. | |
| 2006/0007517 A1 | 1/2006 | Tsai | |
| 2006/0017379 A1 | 1/2006 | Su et al. | |
| 2006/0017689 A1 | 1/2006 | Faase et al. | |
| 2006/0024880 A1 | 2/2006 | Chui et al. | |
| 2006/0038643 A1 | 2/2006 | Xu et al. | |
| 2006/0065940 A1 | 3/2006 | Kothari | |
| 2006/0066541 A1 | 3/2006 | Gally et al. | |
| 2006/0066640 A1 | 3/2006 | Kothari et al. | |
| 2006/0066641 A1 | 3/2006 | Gally et al. | |
| 2006/0066783 A1 | 3/2006 | Sampsell | |
| 2006/0066935 A1 | 3/2006 | Cummings et al. | |
| 2006/0067633 A1 | 3/2006 | Gally et al. | |
| 2006/0077155 A1 | 4/2006 | Chui et al. | |
| 2006/0077156 A1 | 4/2006 | Chui et al. | |
| 2006/0082588 A1 | 4/2006 | Mizuno et al. | |
| 2006/0082863 A1 | 4/2006 | Piehl et al. | |
| 2006/0130889 A1 | 6/2006 | Li et al. | |

| | | |
|---|---|---|
| 2006/0132927 A1 | 6/2006 | Yoon |
| 2006/0180886 A1 | 8/2006 | Tsang |
| 2006/0201546 A1* | 9/2006 | Yokoyama ................ 136/263 |
| 2006/0220160 A1 | 10/2006 | Miles |
| 2006/0261330 A1 | 11/2006 | Miles |
| 2006/0262126 A1 | 11/2006 | Miles |
| 2006/0262562 A1 | 11/2006 | Fukasawa et al. |
| 2006/0274400 A1 | 12/2006 | Miles |
| 2007/0020948 A1 | 1/2007 | Piehl et al. |
| 2007/0031097 A1 | 2/2007 | Heikenfeld et al. |
| 2007/0077525 A1 | 4/2007 | Davis et al. |
| 2007/0086078 A1 | 4/2007 | Hagood et al. |
| 2007/0097694 A1 | 5/2007 | Faase et al. |
| 2007/0113887 A1 | 5/2007 | Laih et al. |
| 2007/0121118 A1 | 5/2007 | Gally et al. |
| 2007/0125415 A1 | 6/2007 | Sachs |
| 2007/0138608 A1 | 6/2007 | Ikehashi |
| 2007/0153860 A1 | 7/2007 | Chang-Hasnain et al. |
| 2007/0171418 A1 | 7/2007 | Nyhart |
| 2007/0177247 A1 | 8/2007 | Miles |
| 2007/0196040 A1 | 8/2007 | Wang et al. |
| 2007/0206267 A1 | 9/2007 | Tung et al. |
| 2007/0216987 A1 | 9/2007 | Hagood et al. |
| 2007/0221269 A1 | 9/2007 | Sakai et al. |
| 2007/0235072 A1* | 10/2007 | Bermel et al. ................. 136/252 |
| 2007/0247704 A1 | 10/2007 | Mignard |
| 2007/0253054 A1 | 11/2007 | Miles |
| 2007/0279730 A1 | 12/2007 | Heald |
| 2007/0285761 A1 | 12/2007 | Zhong et al. |
| 2008/0002299 A1 | 1/2008 | Thurn |
| 2008/0013145 A1 | 1/2008 | Chui et al. |
| 2008/0030657 A1* | 2/2008 | Wu et al. ................. 349/106 |
| 2008/0037093 A1 | 2/2008 | Miles |
| 2008/0050286 A1 | 2/2008 | Elliott et al. |
| 2008/0055706 A1 | 3/2008 | Chui et al. |
| 2008/0055707 A1 | 3/2008 | Kogut et al. |
| 2008/0068697 A1 | 3/2008 | Haluzak et al. |
| 2008/0080043 A1 | 4/2008 | Chui et al. |
| 2008/0088904 A1 | 4/2008 | Miles |
| 2008/0088910 A1 | 4/2008 | Miles |
| 2008/0088912 A1 | 4/2008 | Miles |
| 2008/0094690 A1 | 4/2008 | Luo et al. |
| 2008/0105298 A1 | 5/2008 | Lu et al. |
| 2008/0106782 A1 | 5/2008 | Miles |
| 2008/0110855 A1 | 5/2008 | Cummings |
| 2008/0158645 A1 | 7/2008 | Chiang |
| 2008/0180784 A1 | 7/2008 | Silverstein et al. |
| 2008/0186581 A1 | 8/2008 | Bita et al. |
| 2008/0218834 A1 | 9/2008 | Wang |
| 2008/0247028 A1 | 10/2008 | Chui et al. |
| 2008/0279498 A1 | 11/2008 | Sampsell et al. |
| 2008/0297880 A1 | 12/2008 | Steckl et al. |
| 2009/0021884 A1 | 1/2009 | Nakamura |
| 2009/0073534 A1 | 3/2009 | Lee et al. |
| 2009/0073540 A1 | 3/2009 | Kothari et al. |
| 2009/0078316 A1 | 3/2009 | Khazeni et al. |
| 2009/0159123 A1 | 6/2009 | Kothari |
| 2009/0201566 A1 | 8/2009 | Kothari |
| 2009/0211885 A1 | 8/2009 | Steeneken et al. |
| 2009/0213450 A1 | 8/2009 | Sampsell |
| 2009/0213451 A1 | 8/2009 | Tung et al. |
| 2009/0219604 A1 | 9/2009 | Miles |
| 2009/0251761 A1 | 10/2009 | Khazeni et al. |
| 2009/0256218 A1 | 10/2009 | Mignard et al. |
| 2009/0257105 A1 | 10/2009 | Xu et al. |
| 2009/0273823 A1 | 11/2009 | Tung et al. |
| 2009/0273824 A1 | 11/2009 | Sasagawa |
| 2009/0279162 A1 | 11/2009 | Chui |
| 2009/0293955 A1 | 12/2009 | Kothari |
| 2010/0039370 A1 | 2/2010 | Miles |
| 2010/0051089 A1 | 3/2010 | Khazeni et al. |
| 2010/0080890 A1 | 4/2010 | Tung et al. |
| 2010/0085626 A1 | 4/2010 | Tung et al. |
| 2010/0118382 A1 | 5/2010 | Kothari et al. |
| 2010/0236624 A1 | 9/2010 | Khazeni et al. |
| 2010/0309572 A1 | 12/2010 | Mignard |
| 2011/0019380 A1 | 1/2011 | Miles |
| 2011/0026095 A1 | 2/2011 | Kothari et al. |
| 2011/0026096 A1 | 2/2011 | Miles |
| 2011/0038027 A1 | 2/2011 | Miles |
| 2011/0044496 A1 | 2/2011 | Chui et al. |
| 2011/0069371 A1 | 3/2011 | Kothari et al. |
| 2011/0080632 A1 | 4/2011 | Miles |
| 2011/0116156 A1 | 5/2011 | Kothari |

FOREIGN PATENT DOCUMENTS

| | | |
|---|---|---|
| DE | 10 2006 039 071 | 2/2008 |
| EP | 0 223 136 | 5/1987 |
| EP | 0 668 490 | 8/1995 |
| EP | 0 695 959 | 2/1996 |
| EP | 0 843 364 | 5/1998 |
| EP | 0 879 991 | 11/1998 |
| EP | 0 969 306 | 1/2000 |
| EP | 0 986 077 | 3/2000 |
| EP | 1 122 577 | 8/2001 |
| EP | 1 205 782 | 5/2002 |
| EP | 1 227 346 | 7/2002 |
| EP | 1 275 997 | 1/2003 |
| EP | 1 369 932 | 12/2003 |
| EP | 1 403 212 | 3/2004 |
| EP | 1 473 581 | 11/2004 |
| EP | 1 640 317 | 3/2006 |
| EP | 1 640 765 | 3/2006 |
| EP | 1 640 767 | 3/2006 |
| EP | 1 640 770 | 3/2006 |
| EP | 1 670 065 | 6/2006 |
| EP | 1 691 429 | 8/2006 |
| EP | 1 928 028 | 6/2008 |
| EP | 2 051 124 | 4/2009 |
| GB | 2 396 436 | 6/2004 |
| JP | 56-088111 | 7/1981 |
| JP | 60-147718 | 8/1985 |
| JP | 02-068513 | 3/1990 |
| JP | 02-151079 | 6/1990 |
| JP | 04-190323 | 7/1992 |
| JP | 04-238321 | 8/1992 |
| JP | 5-49238 | 2/1993 |
| JP | 5-281479 | 10/1993 |
| JP | 08 051230 | 2/1996 |
| JP | 08-094992 | 4/1996 |
| JP | 09-068722 | 3/1997 |
| JP | 09-281917 | 10/1997 |
| JP | 11-211999 | 8/1999 |
| JP | 11-295725 | 10/1999 |
| JP | 11-295726 | 10/1999 |
| JP | 2002-062490 | 2/2000 |
| JP | 2000 147262 | 5/2000 |
| JP | 2001-221913 | 8/2001 |
| JP | 2001 249283 | 9/2001 |
| JP | 2001-345458 | 12/2001 |
| JP | 2002-062490 | 2/2002 |
| JP | 2002-174780 | 6/2002 |
| JP | 2002-221678 | 8/2002 |
| JP | 2003-340795 | 2/2003 |
| JP | 2003 177336 | 6/2003 |
| JP | 2004-012642 | 1/2004 |
| JP | 2004-212638 | 7/2004 |
| JP | 2004-212680 | 7/2004 |
| JP | 2005 279831 | 10/2005 |
| JP | 05-308871 | 11/2005 |
| JP | 2006-065360 | 3/2006 |
| JP | 2007 027150 | 2/2007 |
| JP | 2007-334132 | 12/2007 |
| KR | 2003-0081662 | 10/2003 |
| WO | WO 94/28452 | 12/1994 |
| WO | WO 95/15582 | 6/1995 |
| WO | WO 97/44707 | 11/1997 |
| WO | WO 98/14804 | 4/1998 |
| WO | WO 99/04296 | 1/1999 |
| WO | WO 00/11502 | 3/2000 |
| WO | WO 02/24570 | 3/2002 |
| WO | WO 02/27805 | 4/2002 |
| WO | WO 02/086582 | 10/2002 |
| WO | WO 03/105198 | 12/2003 |
| WO | WO 2004/114418 | 12/2004 |
| WO | WO 2006/034377 | 3/2006 |
| WO | WO 2006/035698 | 4/2006 |
| WO | WO 2006/137337 | 12/2006 |

| WO | WO 2007/036422 | 4/2007 |
| WO | WO 2007/045875 | 4/2007 |
| WO | WO 2007/053438 | 5/2007 |
| WO | WO 2007/072998 | 6/2007 |
| WO | WO 2007/073203 | 6/2007 |
| WO | WO 2008/062363 | 5/2008 |
| WO | WO 2008/067024 | 6/2008 |

OTHER PUBLICATIONS

International Preliminary Report on Patentability from PCT/US08/078498 dated Jan. 29, 2010.
IPRP dated Jan. 29, 2010 in PCT/US08/078498.
Office Action dated Feb. 4, 2010 in U.S. Appl. No. 12/254,766.
IPRP dated Jan. 29, 2010 in PCT/US08/080222.
Specification for Pathfinder™ Watch (Model No. PAW1300-1V) on worldwide web page for Casio.com, printed on Oct. 20, 2008.
ISR and WO dated Jun. 19, 2009 in PCT/US08/078498.
Extended European Search Report dated Jun. 19, 2009 in App. No. 08153685.6.
ISR and WO dated Jun. 19, 2009 in PCT/US08/080222.
ISR and WO dated Jun. 19, 2009 in PCT/US08/080225.
Pohlack, Jan. 1, 1983, Grundlagen und anwendungen der induzierten resonanzabsoprtion (teil 1), Feingeraetetechnik, XX, XX, vol. 32, No. 7, pp. 321-326.
Office Action dated Aug. 6, 2010 in U.S. Appl. No. 11/950,392, filed Dec. 4, 2007.
Chemical Properties Handbook, 1999, Refractive Index, Dipole Moment, and Radius of Gyration; Inorganic Compounds, McGraw-Hill, 1 pp.
Office Action dated Jan. 19, 2011 in U.S. Appl. No. 11/950,392.
Londergan et al., Advanced processes for MEMS-based displays, Proceedings of the Asia Display 2007, SID, 1:107-112.
Nakagawa et al., Feb. 1, 2002, Wide-field-of-view narrow-band spectral filters based on photonic crystal nanocavities, Optics Letters, 27(3):191-193.
Carabe, J, et al., "Thin-film-silicon solar cells." OPTO-Electronics Review 12, No. 1, pp. 1-6, 2004.
Conner, Hybrid Color Display Using Optical Interference Filter Array, SID Digest, pp. 577-580 (1993).
Feenstra et al., Electrowetting displays, Liquavista BV, 16 pp., Jan. 2006.
Jerman et al., A Miniature Fabry-Perot Interferometer with a Corrugated Silicon Diaphragm Support, (1988).
Jerman et al., Miniature Fabry-Perot Interferometers Micromachined in Silicon for Use in Optical Fiber WDM Systems, Transducers, San Francisco, Jun. 24-27, 1991, Proceedings on the Int'l Conf. on Solid State Sensors and Actuators, Jun. 24, 1991, pp. 372-375.
Kowarz et al., Conformal grating electromechanical system (GEMS) for high-speed digital light modulation, Proceedings of the IEEEE 15th. Annual International Conference on Micro Electro Mechanical Systems, MEMS 2002, pp. 568-573.
Lezec, Submicrometer dimple array based interference color field displays and sensors, Nano Lett. 7(2):329-333, Dec. 23, 2006.
Longhurst, 1963, Chapter IX: Multiple Beam Interferometry, in Geometrical and Physical Optics, pp. 153-157.
Magel, G.A. (1996) Integrated optic devices using micromachined metal membranes. SPIE 2686:54-63.
Miles, A New Reflective FPD Technology Using Interferometric Modulation, Journal of the SID, 5-4, 1997.
Miles, Interferometric modulation: MOEMS as an enabling technology for high performance reflective displays, Proceedings of SPIE, 4985:131-139, 2003.
Pape et al., Characteristics of the deformable mirror device for optical information processing, Optical Engineering, 22(6):676-681, Nov.-Dec. 1983.
Sopori, J. et al., "Light-Trapping in a-Si Solar Cells: A Summary of the Results from PV Optics," Presented at the National Center for Photovoltaics Program Review Meeting—Denver, Colorado, pp. 1-6, Sep. 8-11, 1998.
Sperger, R. et al., "High performance patterned all-dielectric interference colour filters for display applications", SID Digest, pp. 81-83, 1994.
Su, "Solar Cells—frontiers in materials and devices." Presentations in EE 666 Advanced Semiconductor Devices, Apr. 14, 2005.
Taii et al., A transparent sheet display by plastic MEMS, Journal of the SID 14(8):735-741, 2006.
Tolansky, 1948, Chapter II: Multiple-Beam Interference, in Multiple-bean Interferometry of Surfaces and Films, Oxford at the Clarendon Press, pp. 8-11.
Winton, John M., "A novel way to capture solar energy", Chemical Week, pp. 17-18, May 15, 1985.
Wu et al., "Design of a Reflective Color LCD Using Optical Interference Reflectors", Changchun Institute of Physics, ASIA Display, pp. 929-930, 1995.
ISR and WO dated Jan. 13, 2009 in PCT/US08/076901.
International Preliminary Report on Patentability in International Application No. PCT/US2008/076901 mailed Jan. 21, 2010.
Final Office Action dated May 28, 2010 in U.S. Appl. No. 11/949,699.
Office Action dated Dec. 3, 2009 in U.S. Appl. No. 11/949,699.
International Preliminary Report on Patentability dated Mar. 29, 2010 in Application No. PCT/US2008/081373.
Petition dated Dec. 23, 2008 and Documents submitted therewith in U.S. Appl. No. 11/950,392.
Decision on the Petition granted Apr. 21, 2009 in U.S. Appl. No. 11/950,392.
European Search Report in European Application No. 08153689.8 mailed Jul. 17, 2009.
International Search Report in International Application No. PCT/US2008/081373 mailed Jul. 17, 2009.
Written Opinion of the International Preliminary Examining Authority in International Application No. PCT/US2008/081373 mailed Feb. 23, 2010.
International Search Report in International Application No. PCT/US2009/035745 mailed Nov. 2, 2009.
International Search Report in International Application No. PCT/US2009/055629 mailed Nov. 2, 2009.
Billard, Tunable Capacitor, 5th Annual Review of LETI, Jun. 24, 2003, p. 7.
Hohlfeld et al., Jun. 2003, Micro-machined tunable optical filters with optimized band-pass spectrum, 12th International Conference on Transducers, Solid-State Sensors, Actuators and Microsystems, 2:1494-1497.
Mehregany et al., 1996, MEMS applications in optical systems, IEEE/LEOS 1996 Summer Topical Meetings, pp. 75-76.
Miles et al, Oct. 21, 1997, A MEMS based interferometric modulator (IMOD) for display applications, Proceedings of Sensors Expo, pp. 281-284.
Nieminen et al., 2004, Design of a temperature-stable RF MEM capacitor, IEEE Journal of Microelectromechanical Systems, 13(5):705-714.
Wang, Jun. 29-Jul. 1, 2002, Design and fabrication of a novel two-dimension MEMS-based tunable capacitor, IEEE 2002 International Conference on Communications, Circuits and Systems and West Sino Expositions, 2:1766-1769.
Qualcomm MEMS Technologies, Inc., May 2008, Interferometric Modulator (IMOD) Technology Overview, White Paper, 14 pp.

* cited by examiner

PHOTOVOLTAIC DEVICES WITH INTEGRATED COLOR INTERFEROMETRIC FILM STACKS

CROSS-REFERENCE TO RELATED APPLICATIONS

This application claims priority under 35 U.S.C. §119(e) to U.S. Provisional Application Ser. No. 60/999,566 filed on Oct. 19, 2007, titled "COLORED PHOTOVOLTAICS USING INTERFEROMETRIC DISPLAY DEVICES AND PHOTOVOLTAIC INTEGRATED INTERFEROMETRIC DISPLAYS", the disclosure of which is hereby expressly incorporated by reference in its entirety.

BACKGROUND

1. Field of the Invention

The invention relates generally to the field of optoelectronic transducers that convert optical energy into electrical energy, such as for example photovoltaic cells.

2. Description of the Related Technology

For over a century fossil fuel such as coal, oil, and natural gas has provided the main source of energy in the United States. The need for alternative sources of energy is increasing. Fossil fuels are a non-renewable source of energy that is depleting rapidly. The large scale industrialization of developing nations such as India and China has placed a considerable burden on the available fossil fuel. In addition, geopolitical issues can quickly affect the supply of such fuel. Global warming is also of greater concern in recent years. A number of factors are thought to contribute to global warming; however, widespread use of fossil fuels is presumed to be a main cause of global warming. Thus there is an urgent need to find a renewable and economically viable source of energy that is also environmentally safe. Solar energy is an environmentally safe renewable source of energy that can be converted into other forms of energy such as heat and electricity.

Photovoltaic (PV) cells convert optical energy to electrical energy and thus can be used to convert solar energy into electrical power. Photovoltaic solar cells can be made very thin and modular. PV cells can range in size from a few millimeters to 10's of centimeters. The individual electrical output from one PV cell may range from a few milliwatts to a few watts. Several PV cells may be connected electrically and packaged in arrays to produce a sufficient amount of electricity. PV cells can be used in a wide range of applications such as providing power to satellites and other spacecraft, providing electricity to residential and commercial properties, charging automobile batteries, etc.

While PV devices have the potential to reduce reliance upon hydrocarbon fuels, the widespread use of PV devices has been hindered by inefficiency and aesthetic concerns. Accordingly, improvements in either of these aspects could increase usage of PV devices.

SUMMARY OF CERTAIN INVENTIVE ASPECTS

Certain embodiments of the invention include photovoltaic cells or devices integrated with interferometric stacks to reflect a visible color or colors to a viewer. Such interferometrically colored photovoltaic devices may be made to reflect any of a broad range of colors, according to the needs of a particular application. This may make them more aesthetically pleasing and therefore more useful in building or architectural applications.

In various embodiments, interferometric thin film stacks are included in the photovoltaic device, and particularly extending over a photovoltaic (PV) active material, to reflect an interferometrically enhanced reflected visible wavelength spectrum so that the device appears to be colored with one or more colors. In embodiments where the color interferometric thin film stack is on the front side of the PV device, the interferometric stack is partially transmissive to enable light to reach the PV device for conversion to electrical current. Relative reflectivity and transmission of visible light are selected by choice of interferometric stack films as a trade-off between intensity of reflected color and degree of transmissions through the interferometric stack, either for conversion in a PV device or for passing through a PV array (e.g., solar panel) between PV devices. The interferometric stack can reflect a uniform color across the array or be patterned to produce a monochrome or multicolored image. In some arrangements where the color interferometric thin film stack extends over the backside of PV devices or arrays, the back side can be partially transmissive as on the front side, or opaque, depending upon the application. In either case, a color interferometric stack can impart a colored appearance as a pattern or a blanket color.

The interferometric thin layers making up the interferometric stack may comprise metal thin films, transparent non-conducting materials such as dielectrics, transparent conducting material, air gaps, and combinations thereof as described herein. In one example, an interferometric film stack is an interferometric modulator (IMOD) that includes an absorber, an optical resonant cavity and an optional reflector. In this example, the IMOD is configured to "modulate" the reflected color by choice of the optical resonant cavity thickness or height. The IMOD may, in some embodiments, have appreciable absorption of light of certain wavelengths in the optical absorber layer and/or reflector layer. In another example, the interferometric film stack includes a dichroic stack of film pairs meant to interferometrically enhance color reflections without appreciable absorption, allowing a straightforward trade-off between reflected color and transmission to the underlying photovoltaic active material, without appreciable absorption.

In one embodiment, a photovoltaic device includes a photovoltaic active material and an interferometric stack covering a first side of the photovoltaic active material. The interferometric stack is configured to selectively enhance reflections of select wavelengths within a visible range of wavelengths. The interferometric stack reflects a visible color on the first side.

In another embodiment, a photovoltaic device having a front side and a back side includes a photovoltaic active layer and an interferometric modulator. The interferometric modulator (IMOD) is configured to interferometrically tune reflections. The interferometric modulator includes one or more optically transparent layers forming an optical resonant cavity over the photovoltaic active layer and an absorber layer over the optical resonant cavity.

In another embodiment, a photovoltaic device includes a photovoltaic active layer and a dichroic stack. The dichroic stack is configured to interferometrically tune light reflections and transmissions. The dichroic stack includes one or more pairs of dielectric films. The one or more pairs include one film with a first index of refraction over another film with a lower index of refraction.

In another embodiment, a method of manufacturing a color photovoltaic device is provided. The method includes providing a photovoltaic material having a front side on which light is incident and a back side. The method also includes forming an interferometric stack over the photovoltaic material. The interferometric stack is configured to interferometrically enhance visible light reflections of a particular color.

In another embodiment, a photovoltaic device includes a means for generating an electrical current from incident light and a means for interferometrically enhancing reflected visible light of a particular color from a first side of the photovoltaic device.

BRIEF DESCRIPTION OF THE DRAWINGS

Example embodiments disclosed herein are illustrated in the accompanying schematic drawings, which are for illustrative purposes only.

DETAILED DESCRIPTION OF CERTAIN EMBODIMENTS

Figure 1:
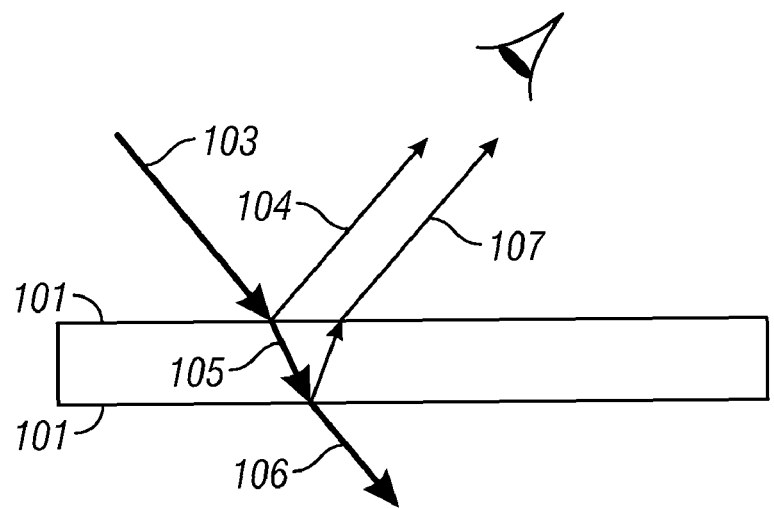
FIG. 1 schematically illustrates a theoretical optical interferometric cavity.

One issue hindering widespread adoption of photovoltaic (PV) devices on available surfaces for conversion of light energy into electric energy or current is the difficulty of integrating them due to their color, in various applications, such as on signs, billboards, or buildings. The active PV material itself typically appears dark, with some shiny conductors often also visible, and both factors can hinder the blending of PV devices with surrounding materials. Embodiments described herein below employ interferometric stack constructions, such as dichroic pairs and IMOD (absorber-cavity-reflector) stacks, designed to enhance reflections of select wavelength spikes or peaks in the visible range using the principles of optical interference. The selective reflections cause the interferometric stack to appear with a certain color to a viewer, and can be designed to appear a certain color according to the needs of a particular application. The interferometric reflection or transmission depending on wavelength is governed by the dimensions and fundamental material properties of the materials making up the interferometric thin film stack. Accordingly, the coloring effect is not as susceptible to fading over time compared to common dyes or paints.

Although certain embodiments and examples are discussed herein, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein. The following detailed description is directed to certain specific embodiments of the invention. However, the invention can be embodied in a multitude of different ways. The embodiments described herein may be implemented in a wide range of devices that incorporate photovoltaic devices for conversion of optical energy into electrical current.

In this description, reference is made to the drawings wherein like parts are designated with like numerals throughout. As will be apparent from the following description, the embodiments may be implemented in a variety of devices that comprise photovoltaic active material.

Initially, FIGS. 1-3F illustrate some optical principles and various types of interferometric thin film stacks that are useful for integrating with photovoltaic devices, as described with respect to FIGS. 5-9C. FIGS. 4A-4E illustrate some photovoltaic device constructions with which interferometric stacks can be integrated. FIGS. 5-9C illustrate embodiments in which interferometric stacks (such as IMODs or dichroic stacks) are integrated with photovoltaic devices.

FIG. 1 illustrates an optical resonant cavity. An example of such an optical resonant cavity is a soap film which may produce a spectrum of reflected colors. An optical resonant cavity is a structure that can be used to interferometrically manipulate light. The optical resonant cavity shown in FIG. 1 comprises upper and lower interfaces 101 and 102. The two interfaces 101 and 102 may be opposing surfaces on the same layer. For example, the two interfaces 101 and 102 may comprise surfaces on a glass or plastic plate or sheet or a film of glass, plastic, or any other transparent material. Air or other media may surround the plate, sheet, or film. The optical resonant cavity may have one material on one side of it at the upper interface 101, and a separate material on the other side at the lower interface 102. The materials forming interfaces 101, 102 with the optical resonant cavity may be a metallic or partially reflecting layer, a transparent media, or a dielectric such as air. Materials forming interfaces 101, 102 with the optical resonant cavity may be the same, or may be different. In the illustrated example, light partially reflects and partially transmits at each of interfaces 101, 102.

A ray of light 103 that is incident on the front surface 101 of the optical resonant cavity is partially reflected as indicated by the light path 104 and partially transmitted through the front surface 101 along light path 105. Ray 103 may have a broad spectral distribution of light. For example, ray 103 may comprise white light, and therefore may have significant components from a broad range of wavelengths within the visible range, 450 nm to 700 nm as well as wavelengths outside the visible range. The transmitted light ray 105 may be partially reflected along light path 107 and partially transmitted out of the resonant cavity along light path 106. The optical properties, including the thickness, of the optical resonant cavity, as well as the properties of the surrounding materials may affect both the amplitude and phase of light reflected from both interface 101 and interface 102. Therefore, rays 104 and 107 will each have an amplitude and a phase, depending on the properties of the optical resonant cavity, and the surrounding media. The example is simplified by omission of multiple internal reflections, as will be appreciated by the skilled artisan.

For purposes of the discussions provided herein, the total intensity of light reflected from the optical resonant cavity is a coherent superposition of the two reflected light rays 104 and 107. With such coherent superposition, both the amplitude and the phase of the two reflected beams contribute to the aggregate intensity. This coherent superposition is referred to as interference. The two reflected rays 104 and 107 may have a phase difference with respect to each other. In some embodiments, the phase difference between the two waves may be 180 degrees (180°) and cancel each other out. If the phase and the amplitude of the two light rays 104 and 107 are configured so as to reduce the intensity at a particular wavelength then the two light beams are referred to as interfering destructively at that wavelength. If on the other hand the phase and the amplitude of the two light beams 104 and 107 are configured so as to increase the intensity at a particular wavelength then the two light rays are referred to as interfering constructively at that wavelength. The phase difference depends on the optical path difference of the two paths, which depends both on the thickness of the optical resonant cavity, the index of refraction of the material between the two surface 101 and 102, and whether the indices of surrounding materials are higher or lower than the material forming the optical resonant cavity. The phase difference is also different for different wavelengths in the incident beam 103. Accordingly, rays 104 and 107 may have a phase difference relative to each other, and this phase difference may vary with wavelength. Thus some wavelengths may interfere constructively and some wavelengths may interfere destructively. In general, the colors and the total intensity reflected and transmitted by the optical resonant cavity thus depend on the thickness and the material forming the optical resonant cavity and surrounding media. The reflected and transmitted wavelengths also depend on viewing angle, different wavelength being reflected and transmitted at different angles.

The principles explained above can be used to construct structures that will interferometrically selectively reflect and/or transmit wavelength spectra or range(s) of visible wavelengths of incident light depending on the wavelength of the light. A structure which affects the reflection or transmission of light depending on its wavelength using the principles of interference can be referred to as an interferometric thin film stack, or more simply an interferometric stack. In some embodiments, the interferometric stack is an interferometric modulator (IMOD) that includes an optical resonant cavity that is sandwiched between an optical absorber and a reflector. The reflector can be a separately provided partially or fully reflective layer. Alternatively, other layer(s) having their own functions in the underlying devices may serve as a composite reflector. In other embodiments, the interferometric stack is a dichroic thin film stack. As will be appreciated by the skilled artisan, unlike the IMOD, the dichroic stack does not employ an absorber and thus can reflect fairly intense interferometric colors without significant absorption, which can be beneficial for transmissive applications on the front side of photovoltaic devices (see FIGS. 5-9C and attendant description). On the other hand, dichroic stacks entail the expense of multiple pairs of dichroic film depositions in order to obtain high reflectivity of the desired color. As will be appreciated by the skilled artisan, where the optical path length for light reflected from the interferometric stack is on about the same order of magnitude as the visible wavelength, the visual effect can be quite stark. As the optical path length increases and exceeds the coherence length of white light (e.g., 5000 nm and above), interference is no longer possible as the phase of the light loses its coherence so that the visual interferometric color effect is lost.

Figure 2A:
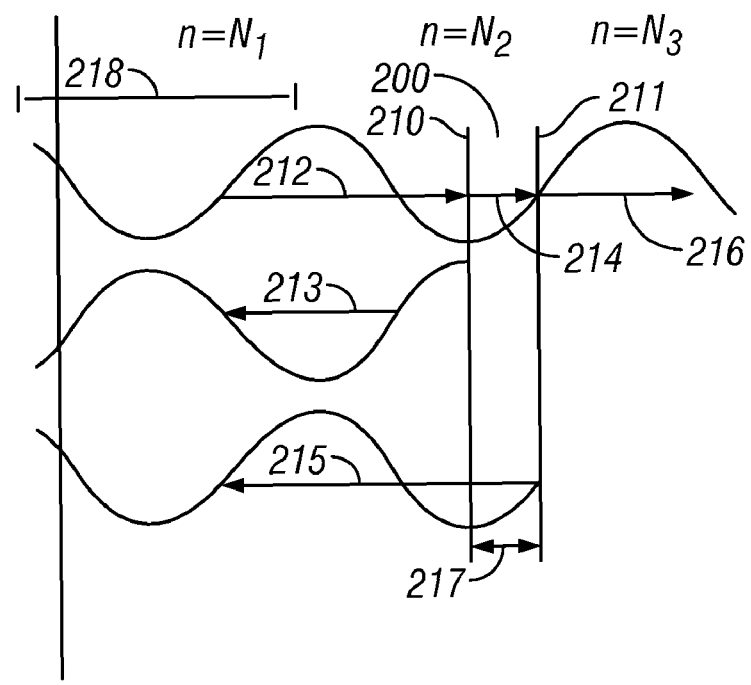
FIG. 2A schematically illustrates reflections the interfaces of an optical resonant cavity.

An example of an optical resonant cavity is shown in FIG. 2A. In FIG. 2A, an optical resonant cavity 200 lies between interfaces 210 and 211. The index of refraction of the optical resonant cavity 200 is $N_2$. As shown in FIG. 2A, ray 212 that is incident on interface 210 may be partly reflected, as indicated by ray 213, and partly transmitted through interface 210 along ray 214. Transmitted ray 214 is further partly reflected as indicated by ray 215 and partly transmitted through surface 211 along ray 216. Often, the thickness of the optical resonant cavity 200 is configured to be on the same order of magnitude as a wavelength within the visible range.

As noted before, both the amplitude and phase of reflected rays 213, 215 at interfaces 210, 211 depend on the index of refraction of the media forming the interfaces 210 and 211, and whether the indices of the various media are higher or lower than each other. In particular, light reflected at an interface as a wave transits from a media with a lower index of refraction to a media with a higher index of refraction undergoes 180° change in phase relative to an incident ray. A transmitted wave at such an interface will undergo no phase change. Hence, if $N_2 > N_1$, ray 213 will have a phase shift of 180° with respect to ray 214.

Similarly, at interface 211, if $N_3 > N_2$, ray 215 will undergo a 180° change in phase relative to ray 214. As illustrated, the thickness 217 of the optical resonant cavity 200 is configured such that it is one quarter wavelength 218 (¼λ) (within the medium) for one of the wavelength components of incident ray 212. Hence, taking into account the thickness 217 of the optical resonant cavity as well as the 180° phase shift upon reflection at interface 211, reflected ray 215 may be 180° out of phase with respect to reflected ray 213. Rays 213 and 215 will therefore destructively interfere. If the amplitude of both rays 213, 215 were equal, then they would totally destructively interfere leaving little or no reflection from surface 210. If the amplitude of both rays were not equal, then they would only partially destructively interfere. Since the thickness 217 of the optical resonant cavity 200 is one fourth of a wavelength for only one specific wavelength (i.e. color, if within the visible range), the destructive interference may only be complete, or maximally destructively interfered, for only one wavelength. For other wavelengths, the destructive interference may be less complete, and hence some reflection may occur. Therefore, as will be appreciated by the skilled artisan, the reflected light from surface 210 will appear a particular color. As will be appreciated by the skilled artisan, ray 215 will also have a reflection and a transmission at interface 210. For simplicity, this and other higher order reflections are ignored for the purpose of discussion.

Whether the reflected rays 213, 215 will constructively or destructively interfere may depend upon the thickness 217 of the optical resonant cavity. For example, if the thickness 217 is configured such that it is one half of a wavelength 218 (½λ) for a particular wavelength components of incident ray 212 (not shown), then the phase of reflected ray 215 may be the same as reflected ray 213, and they may constructively interfere. Constructive interference may cause a significant reflection from interface 210. Since the thickness 217 is one half of a wavelength for only one specific wavelength, the constructive interference may be maximum for only one wavelength. For other wavelengths, the constructive interference may be less complete, and hence less reflection may occur than at the wavelength corresponding to the optical resonant cavity thickness 217. Hence the reflection will be selectively enhanced for certain wavelengths which, if in the visible range, will result in an overall reflected appearance of a certain color.

An interferometric stack can comprise a pair of optical thin films like the one shown in FIG. 2A. If the index of refraction of one optical thin film is greater than the other, as explained above, reflected rays may undergo a phase shift relative to the incident ray. Such a pair of optical thin films is called a dichroic pair. A dichroic pair may result in constructive or destructive interference depending on the optical properties of the two films, including the thickness of each film relative to a wavelength. Similarly, an interferometric stack may comprise multiple pairs of optical films as shown in FIG. 2B.

Figure 2B:
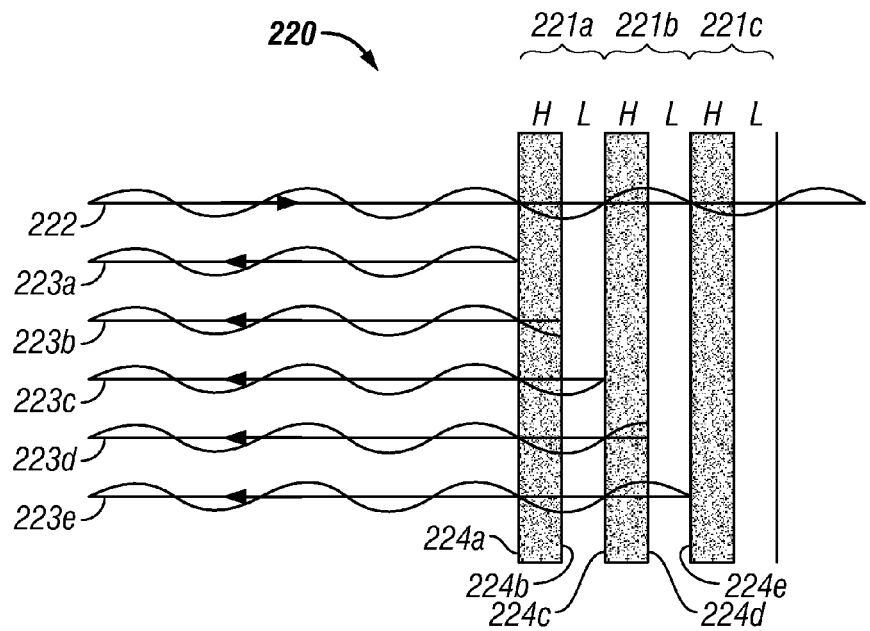
FIG. 2B illustrates reflections at the interfaces of an interferometric stack comprising dichroic film pairs.

In FIG. 2B, of an interferometric stack 220 is formed by three dichroic film pairs 221a, 221b, 221c. Each pair comprises a medium of relatively high index of refraction (H), and a medium of relatively low index of refraction (L). As explained above, the use of successively relatively high and low indices of refraction allows for a reflection that may be phase shifted 180° for each reflection from an interface such that light is travelling from a medium with a first index of refraction (L) to a medium with a higher index of refraction (H). The index of refraction of all the layers may be different from each other and need not be the same. Hence, it is not necessary that all relatively high index of refraction layers have the same index of refraction, and likewise for layers for relatively low index of refraction.

In FIG. 2B, the dichroic pairs 221a, 221b, 221c, are configured so that the thickness of each layer is equal to a quarter wavelength (¼λ) for a wavelength of interest. As illustrated, incident ray 221a travels through air or other relatively low index of refraction material. Ray 222 may be incident upon the first dichroic pair 221a resulting in some reflection and some transmission. The relative phase of any reflected ray 223a-223e once it reflects out of the interferometric stack 220 at interface 224a depends both on whether the reflected ray 223a-223e undergoes a phase shift at an interface 224a-224e between two media as well as the optical path length traveled by the any reflected ray 223a-223e. In the following discussion, phase will be discussed relative to the phase of incident ray 222 at interface 224a. As is known to those of skill in the art, FIG. 2B depicts reflected ray 223a as 180° out of phase relative to incident ray 222 at interface 224a. Dichroic pair 221a comprises a relatively high index of refraction layer and a relatively low index of refraction layer. As shown in FIG. 2B, the index of refraction of the second layer in dichroic pair 221a is relatively lower than the index of refraction of the first layer and therefore reflected ray 223b undergoes no phase shift on reflection at interface 224b. However, with respect to the phase of incident ray 222 at interface 224a, reflected ray 223b at interface 224b is phase shifted by 90° due to the optical path of the quarter wavelength optical thin film. As reflected ray 223b traverses the quarter wavelength optical thin film once again upon reflection, it is phase shifted yet another 90° relative to incident ray 222 at interface 224a. Hence, at interface 224a, reflected ray 223b is phase shifted by 180° relative to incident ray 222. Since first reflected ray 223a is also phase shifted by 180° relative to incident ray 222 at interface 224a, reflected rays 223a and 223b are in phase, and therefore, they constructively interfere. Similarly for the reflections of rays 223c, 223d, and 223e at interfaces 224c, 224d, and 224e. The total reflection from interferometric stack 220 will be equal to a coherent superposition of rays 223a-223e, and in case of constructive interference, the reflection may be significant. As explained above, the reflection may be maximized for a wavelength of light (i.e., color if in the visible range) depending upon the thickness of the optical resonant cavities forming the dichroic pairs 221, 221b, 221c.

Figure 2C:
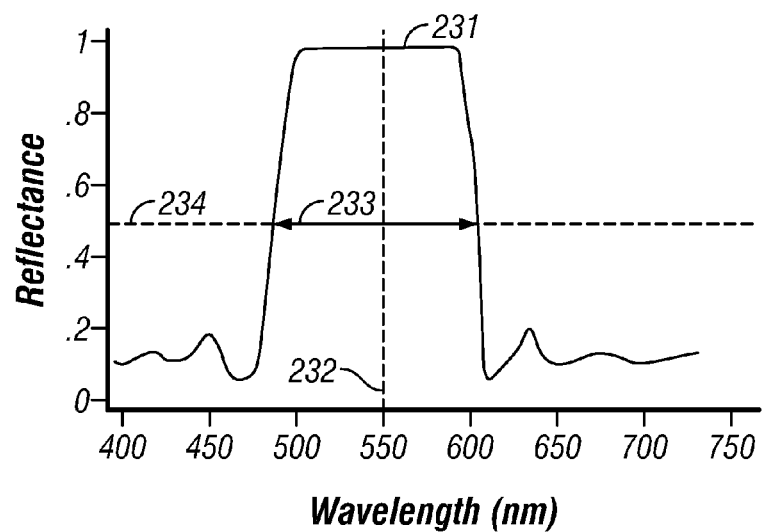
FIG. 2C shows the reflectance versus wavelength for a dichroic stack similar to that of FIG. 2B.

FIG. 2C shows a graph of reflectance versus wavelength for an interferometric stack similar to that of FIG. 2B. As expressed in the graph, an interferometric stack of multiple dichroic pairs can maximize reflections for a certain range of wavelengths, depending upon the thickness of the optical thin films within in each dichroic pair. In the illustrated graph, the reflectance may be maximized around a peak 231 of approximately 550 nm. Hence, the peak wavelength 232 may be approximately 550 nm, corresponding to a quarter wavelength optical resonant cavity thickness of one fourth of 550 nm, or approximately 1375 Å (angstroms) for a medium with an index of refraction of 1.0 (air). As will be clear to the skilled artisan, the actual thickness of an optical thin film within a dichroic pair will depend upon the index of refraction of the medium or media making up the optical thin film. Generally speaking, for an index of refraction of $n_o$ and an optical resonant cavity thickness in air of $t_{air}$, the thickness of the equivalent optical thin film will equal $t_{air}/n_o$. Hence, generally speaking, the two optical thin films forming a dichroic pair may have slightly different thicknesses as dictated by the indices of refraction of the thin films. Peak 231 also has a half-peak bandwidth 233, which may be the width of the peak at a reflectance 234 equal to half of the peak or maximum reflectance. The half-peak bandwidth for FIG. 2C is approximately 100 nm. The color reflected out of an interferometric stack with properties like those depicted in FIG. 2C may have a greenish tint or be green. The skilled artisan will appreciate that other interferometric stack constructions may result in multiple peaks within the visible range to produce a different (e.g., non-primary) color. For example, the dichroic pairs 221a-221c of FIG. 2b may have larger thicknesses such that constructive interference occurs for multiple wavelength peaks in the visible range.

Figure 2D:
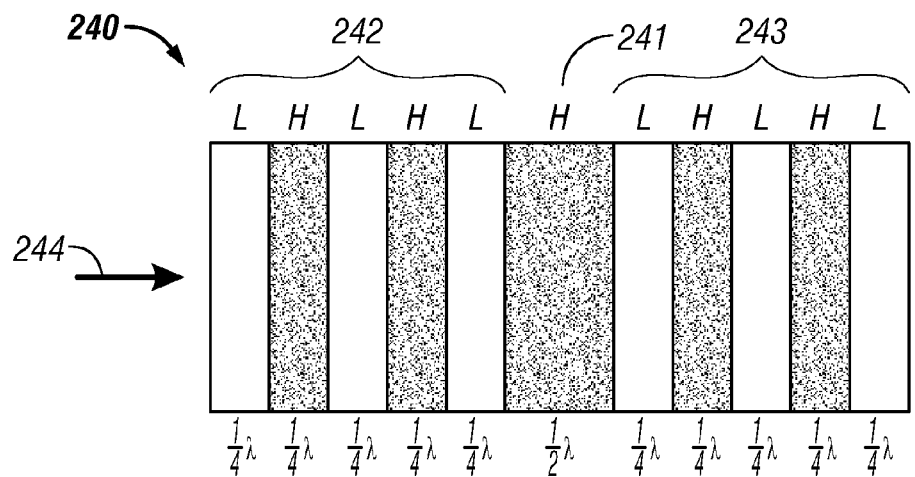
FIG. 2D illustrates another type of interferometric stack comprising dichroic pairs.
Figure 2E:
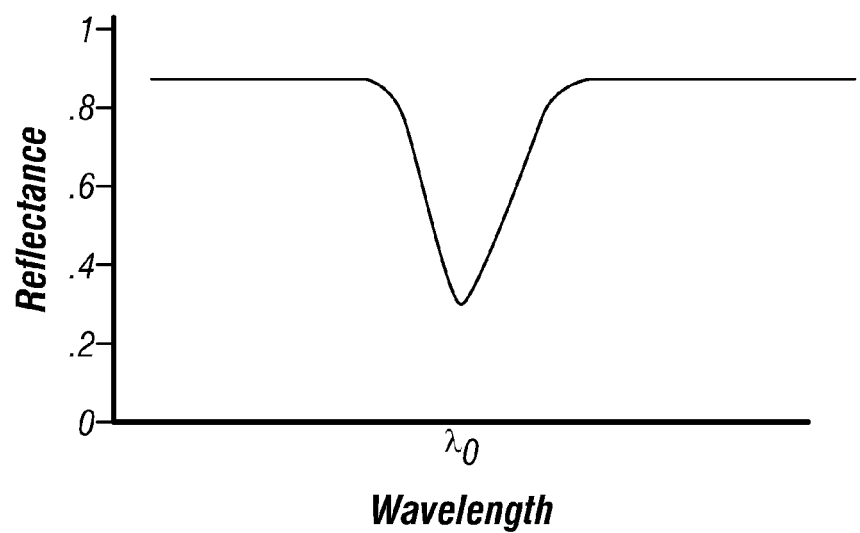
FIG. 2E shows the reflectance versus wavelength for an interferometric stack similar to that of FIG. 2D.

FIG. 2D illustrates another interferometric stack 240 comprising dichroic pairs. In the illustrated embodiment, a high index optical thin film 241 is sandwiched between two stacks of dichroic pairs 242, 243. Unlike the interferometric stack 220 of FIG. 2B, which may maximize reflections at a certain wavelength, this embodiment may minimize reflections at a particular wavelength. In this example, unlike FIG. 2B, the first optical thin film that an incident ray 244 strikes is a quarter wavelength thick optical thin film of relatively low index of refraction. A graph depicting the reflectance out of the interferometric stack 240 as a function of wavelength is shown in FIG. 2E. As can be seen, the thickness of the optical thin films determines the wavelength at which reflection will be either maximized or minimized.

Figure 3A:
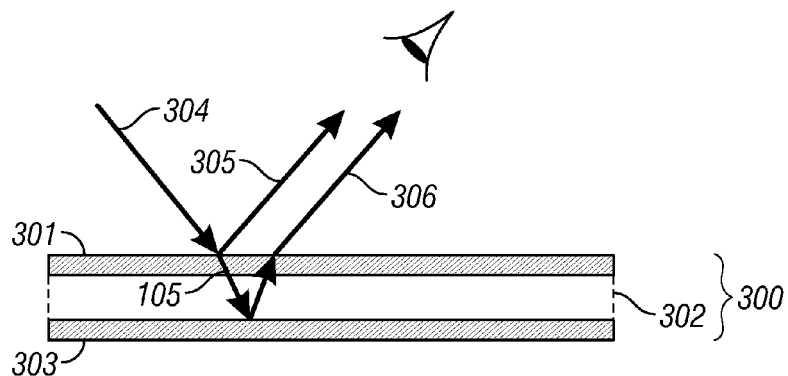
FIG. 3A schematically illustrates of an interferometric modulator (IMOD) including an absorber and an optical resonant cavity.

FIG. 3A depicts an interferometric stack in the form of an interferometric modulator (IMOD) 300. An IMOD 300 includes an absorber layer 301 and an optical resonant cavity 302. In FIG. 3A, the optical resonant cavity 302 is sandwiched between two reflective surfaces. In particular, the absorber layer 301 defines the top of the optical resonant cavity 302 while a bottom reflector layer 303 defines the bottom of the optical resonant cavity 302. The thickness of the absorber and reflector layers 301, 303 may be selected to control relative amounts of reflectance and transmittance of light. Both the absorber and reflector layers may comprise metal, and both can be made partially transmissive. As shown in FIG. 3A, the ray of light 304 that is incident on the absorber layer 301 of the optical interference cavity may be partially reflected out of the optical interference cavity along each of the paths 305 and 306. The illumination field as viewed by an observer on the front or incident side is a superposition of the two reflected rays 305 and 306. The amount of light substantially reflected or transmitted through the bottom reflector 303 can be significantly increased or reduced by varying the thickness and the composition of the reflector layers, whereas the apparent color of reflections is largely determined by the interference effect governed by the size or thickness of the optical resonant cavity 101 and the material properties of the absorber layer 301 that determine the difference in optical path length between the rays 305 and 306. Modulating the bottom reflector thickness 303 (or omitting in favor of whatever reflectivity is provided by an interface between the optical resonant cavity 302 and an underlying medium) will modulate the intensity of the reflected color versus the overall reflectivity of the IMOD 300 and thus influence the intensity of transmissions through the IMOD 300.

In some IMODs, the optical cavity 302 is defined by a layer, such as an optically transparent dielectric layer, or plurality of layers. In other IMODs, the optical resonant cavity 302 is defined by an air gap or combination of optically transparent layer(s) and an air gap. The size of the optical resonant cavity 302 may be tuned to maximize or minimize the reflection of one or more specific colors of the incident light. The color or colors reflected by the optical interference cavity may be changed by changing the thickness of the cavity. Accordingly, the color or colors reflected by the optical interference cavity may depend on the thickness of the cavity.

Figure 3B:
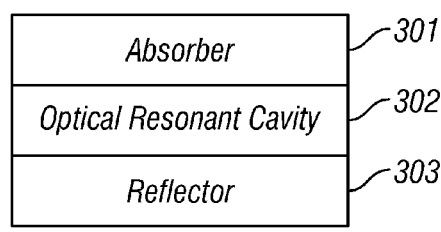
FIG. 3B is a block diagram of an IMOD, similar to that of FIG. 3A, comprising an absorber layer, an optical resonant cavity, and a reflector.

FIG. 3B is a simplified schematic of an interferometric stack in the form of an IMOD 300. As illustrated, the IMOD 300 is an absorber-cavity-reflector stack comprising an absorber 301, a partial or full reflector 303, and an optical resonant cavity 302 formed between the absorber 301 and the reflector 303. The absorber may comprise various materials such as molybdenum (Mo), titanium (Ti), tungsten (W), chromium (Cr), etc., as well as alloys such as MoCr. The reflector 303 may, for example, comprise a metal layer, such as aluminum (Al), silver (Ag), molybdenum (Mo), gold (Au), Cr, etc., and may be typically thick enough to be opaque (e.g., 300 nm). In other IMODs, the reflector 303 is a partial reflector and may be as thin as 20 Å. Generally, a metallic reflector 303 that is a partial reflector will be between 20 and 300 Å. The optical resonant cavity 302 may comprise an air gap and/or one or more optically transparent materials. If the optical resonant cavity 302 is defined by a single layer between the reflector 303 and the absorber layer 301, a transparent conductor or transparent dielectric may be used. Exemplary transparent materials for the optical interference cavity 302 may comprise dielectrics such as silicon dioxide ($SiO_2$), titanium dioxide ($TiO_2$), magnesium fluoride ($MgF_2$), chromium (III) oxide ($Cr_3O_2$), silicon nitride ($Si_3N_4$), etc., as well as transparent conductive oxides (TCOs) such as indium tin oxide (ITO), zinc oxide (ZnO), etc. More generally, any dielectric with an index of refraction (n) between 1 and 3 may form a suitable optical resonant cavity. In situations where a conductive color IMOD stack is required, the optical interference cavity 302 may comprise conductive transparent films. In some IMODs, the optical resonant cavity 302 can comprise a composite structure comprising multiple materials that may include two or more of an air gap, a transparent conducting material, and a transparent dielectric layer. A possible advantage of multiple layers and/or air gaps is that selected layers of the stack may serve multiple functions, such as device passivation or scratch resistance in addition to its optical role in the IMOD 300. In some embodiments, the optical resonant cavity may comprise one or more partially transparent materials, whether conductive or dielectric.

Figure 3C:
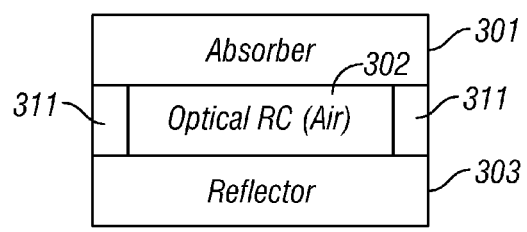
FIG. 3C schematically illustrates an IMOD where the optical cavity includes an air gap formed by posts or pillars between the absorber and reflector layers.

With reference to FIG. 3C, in other embodiments the thickness of the optical resonant cavity 302 may comprise an air gap 302 supported by spacers 311, such as rails, posts or pillars. Within the IMOD 300, the optical resonant or interference cavity 302 may be an air gap that is static, or one that is dynamic, i.e., variable using, for example, MEMS technology.

An interferometric modulator (IMOD) structure 300 such as shown in FIG. 3B or 3C selectively produces a desired reflection output using optical interference. This reflected output may be "modulated" by selection of the thickness and optical properties of a static optical resonant cavity 302, as well as the thickness and optical properties of the absorber 301 and the reflector 303. Alternatively, the reflected output of the IMOD 300 of FIG. 3C may be varied dynamically using a MEMS device to change the size of the optical resonant cavity 302. The color observed by a viewer viewing the surface of the absorber 301 will correspond to those frequencies that are substantially reflected out of the IMOD 300 and are not substantially absorbed or destructively interfered by the various layers of the IMOD 300. The frequencies that interfere and are not substantially absorbed can be varied by selecting the thickness of the optical resonant cavity 302.

Figure 3D:
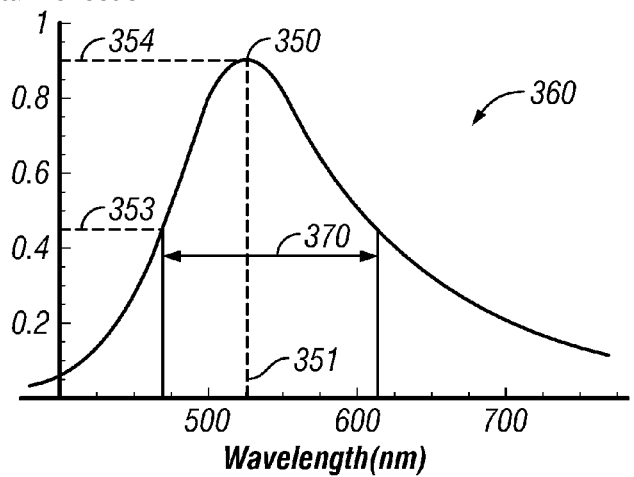
FIG. 3D shows total reflection versus wavelength of an IMOD with an optical cavity configured to reflect yellow for normally incident and reflected light.

FIG. 3D illustrates a graph of reflectance of an IMOD (for example, the IMOD 300 of FIG. 3B or 3C) versus wavelength as seen from a direction normal or perpendicular to the front surface of the IMOD. This graph depicts the wavelength spectrum of the reflected light which may generally be different from the wavelength spectrum of the light incident on the IMOD. In the illustrated graph, the reflectance is maximized around a peak 350 of approximately 540 nm. Hence, the peak wavelength 351 is approximately 540 nm (yellow). Peak 350 also has a half-peak bandwidth 352, which is the width of the peak at a reflectance 353 equal to half of the peak or maximum reflectance 354. As mentioned previously, the location of the peak of the total reflection curve can be shifted by changing either the thickness or material of the optical resonant cavity 302 or by changing the material and thickness of one or more layers in the stack. The location of the peak may depend on viewing angle. As illustrated, there is only one peak; however, there may be multiple peaks of different amplitude depending on the height or thickness of the cavity. As will be known to one of skill in the art, the IMOD may also be configured to modulate absorptance or transmittance as well as reflectance.

Figure 3E:
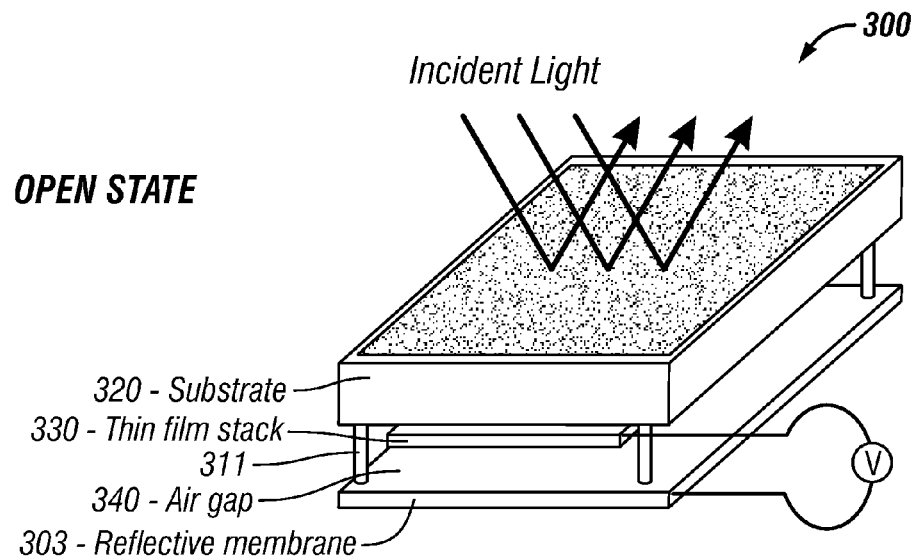
FIG. 3E illustrates a MEMS IMOD in an "open" state, wherein the optical resonant cavity can be adjusted electromechanically.
Figure 3F:
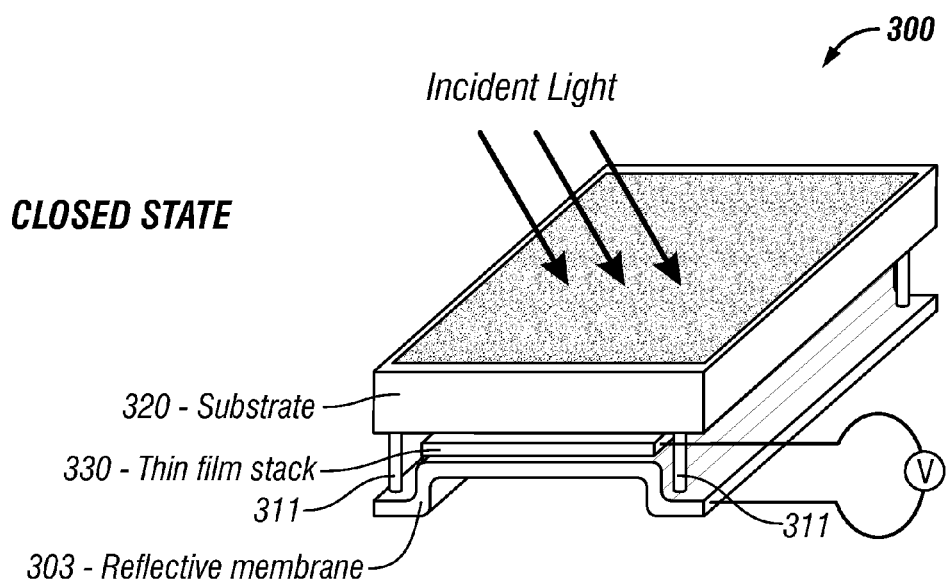
FIG. 3F illustrates the MEMS IMOD of FIG. 3E, where the IMOD is shown in a "closed" state.

FIGS. 3E and 3F show an example of an IMOD 300 wherein the optical resonant cavity (302 in FIG. 3B) includes an air gap and can be electromechanically changed using MEMS technology. FIG. 3E illustrates an IMOD 300 configured to be in the "open" state and FIG. 3F illustrates an IMOD configured to be in the "closed" or "collapsed" state. The IMOD 300 illustrated in FIGS. 3E and 3F comprises a substrate 320, an optical thin film stack 330 and a reflective membrane 303. The optical thin film stack 330 may comprise an absorber (corresponding to 303 in FIGS. 3B and 3C) as well as other layers and materials, such as a separate transparent electrode and dielectric layer. In some embodiments, the optical thin film stack 330 may be attached to the substrate 320. In the "open" state, the optical thin film stack 330 is separated from the reflective membrane 303 by a gap 340. In some embodiments, for example, as illustrated in FIG. 3C, the gap 340 may be an air gap, supported by spacers 311, such as rails, pillars or posts. In the "open" state, the thickness of the gap 340 can vary, for example, between 120 nm and 400 nm (e.g., approximately 260 nm) in some embodiments. Hence, in the "open" state, the optical resonant cavity of FIGS. 3B and 3C comprises the air gap together with any transparent layers over the absorber within the thin film stack 330.

In certain arrangements, the IMOD 300 can be switched from the "open" state to the "closed" state by applying a voltage difference between the thin film stack 330 and the reflective membrane 303 as illustrated in FIG. 3F. In the "closed" state, the optical cavity over the absorber between the thin film stack 330 and the reflective membrane 303 is defined by, e.g., a dielectric layer overlying the absorber in the thin film stack 330, and is typically configured to reflect "black" or minimal visible reflections, but can also be configured to reflect broad band white in the closed state. The thickness of the air gap in general can vary between approximately 0 nm and approximately 2000 nm, for example, between "open" and "closed" states in some embodiments.

In the "open" state, one or more frequencies of the incident light interfere constructively above the surface of the substrate 320. Accordingly, some frequencies of the incident light are not substantially absorbed within the IMOD 300 but instead are reflected from the IMOD 300. The frequencies that are reflected out of the IMOD 300 interfere constructively outside the IMOD 300. The display color observed by a viewer viewing the surface of the substrate 320 will correspond to those frequencies that are substantially reflected out of the IMOD 300 and are not substantially absorbed by the various layers of the IMOD 300. The frequencies that interfere constructively and are not substantially absorbed can be varied by changing the thickness of the optical cavity (which includes the gap 340), thereby changing the thickness of the optical resonant cavity. While described in terms of electrostatic MEMS, the skilled artisan will appreciate that the reflective membrane 303 can be moved or switched from the "open" to the "closed" state by other means such as by pressure, temperature, or by piezoelectric effect.

Figure 4A:
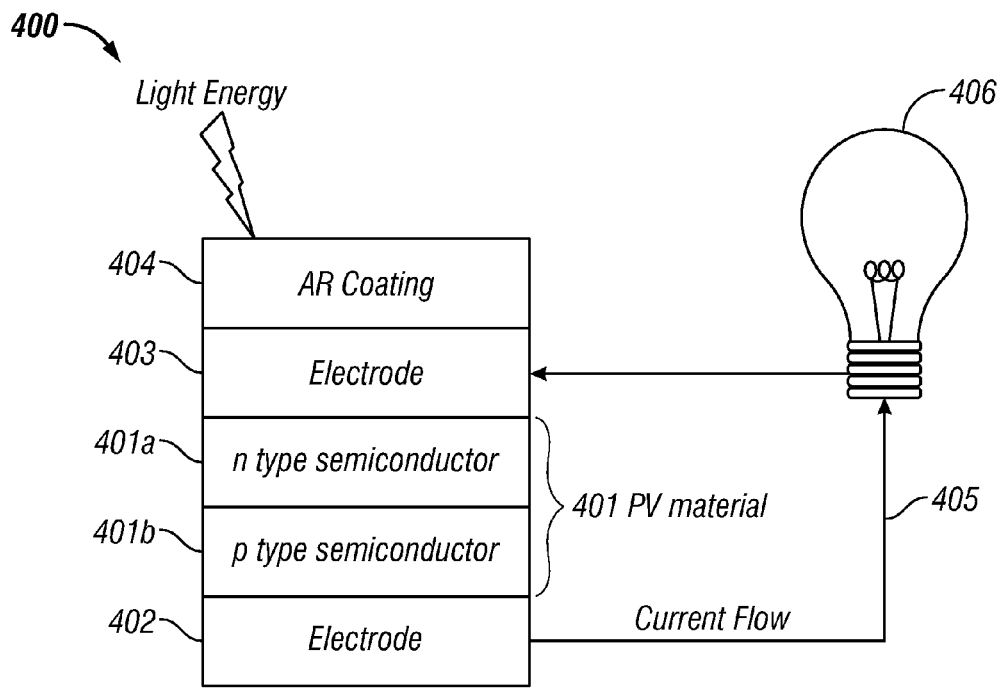
FIG. 4A schematically illustrates a photovoltaic cell comprising a p-n junction.

FIG. 4A shows a typical photovoltaic (PV) cell 400. A typical photovoltaic cell can convert light energy into electrical energy or current. A PV cell is an example of a renewable source of energy that has a small carbon footprint and has less impact on the environment. Using PV cells can reduce the cost of energy generation. PV cells can have many different sizes and shapes, e.g., from smaller than a postage stamp to several inches across. Several PV cells can often be connected together to form PV cell modules that may be up to several feet long and a few feet wide. Modules, in turn, can be combined and connected to form PV arrays of different sizes and power output.

The size of an array can depend on several factors, such as the amount of sunlight available in a particular location and the needs of the consumer. The modules of the array can include electrical connections, mounting hardware, power-conditioning equipment, and batteries that store solar energy for use when the sun is not shining. A PV device can be a single cell with its attendant electrical connections and peripherals, a PV module, a PV array, or solar panel. A PV device can also include functionally unrelated electrical components, e.g., components that are powered by the PV cell(s).

With reference to FIG. 4A, a typical PV cell comprises a PV active region 401 disposed between two electrodes 402, 403. In some embodiments, the PV cell comprises a substrate on which a stack of layers is formed. The PV active layer of a PV cell may comprise a semiconductor material such as silicon. In some embodiments, the active region may comprise a p-n junction formed by contacting an n-type semiconductor material 401a and a p-type semiconductor material 401b as shown in FIG. 4A. Such a p-n junction may have diode-like properties and may therefore be referred to as a photodiode structure as well.

The PV active material 401 is sandwiched between two electrodes that provide an electrical current path. The back electrode 402 can be formed of aluminum, silver, or molybdenum or some other conducting material. The back electrode can be rough and unpolished. The front electrode 403 may be designed to cover a significant portion of the front surface of the p-n junction so as to lower contact resistance and increase collection efficiency. In embodiments wherein the front electrode 403 is formed of an opaque material, the front electrode 403 may be configured to leave openings over the front of the PV active layer to allow illumination to impinge on the PV active layer. In some embodiments, the front electrodes can include a transparent conductor, for example, transparent conducting oxide (TCO) such as tin oxide ($SnO_2$) or indium tin oxide (ITO). The TCO can provide electrical contact and conductivity and simultaneously be transparent to the incoming light. In some embodiments, the PV cell can also comprise an anti-reflective (AR) coating 404 disposed over the front electrode 403. The AR coating 404 can reduce the amount of light reflected from the front surface of the PV active material 401.

When the front surface of the PV active material 401 is illuminated, photons transfer energy to electrons in the active region. If the energy transferred by the photons is greater than the band-gap of the semiconducting material, the electrons may have sufficient energy to enter the conduction band. An internal electric field is created with the formation of the p-n junction. The internal electric field operates on the energized electrons to cause these electrons to move, thereby producing a current flow in an external circuit 405. The resulting current flow can be used to power various electrical devices, such as a light bulb 406 as shown in FIG. 4A.

The PV active layer(s) can be formed by any of a variety of light absorbing, photovoltaic materials such as crystalline silicon (c-silicon), amorphous silicon (α-silicon), cadmium telluride (CdTe), copper indium diselenide (CIS), copper indium gallium diselenide (CIGS), light absorbing dyes and polymers, polymers dispersed with light absorbing nanoparticles, III-V semiconductors such as GaAs, etc. Other materials may also be used. The light absorbing material(s) where photons are absorbed and transfer energy to electrical carriers (holes and electrons) is referred to herein as the PV active layer or material of the PV cell, and this term is meant to encompass multiple active sub-layers. The material for the PV active layer can be chosen depending on the desired performance and the application of the PV cell.

In some arrangements, the PV cell can be formed by using thin film technology. For example, in one embodiment, where optical energy passes through a transparent substrate, the PV cell may be formed by depositing a first or front electrode layer of TCO on a substrate. PV active material may be deposited on the first electrode layer. A second electrode layer can be deposited on the layer of PV active material. The layers may be deposited using deposition techniques such as physical vapor deposition techniques, chemical vapor deposition techniques, electro-chemical vapor deposition techniques, etc. Thin film PV cells may comprise amorphous or polycrystalline materials such as thin-film silicon, CIS, CdTe or CIGS. Some advantages of thin film PV cells are small device footprint and scalability of the manufacturing process among others.

Figure 4B:
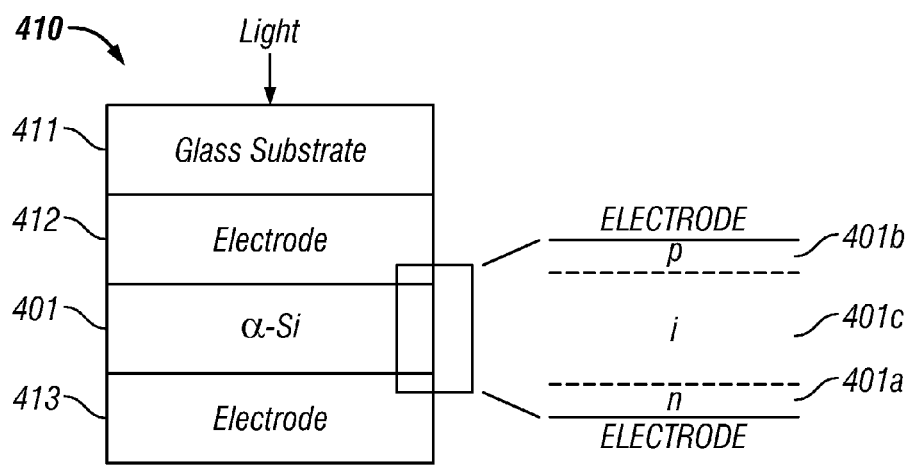
FIG. 4B is a block diagram that schematically illustrates a photocell comprising a deposited thin film photovoltaic active material.

FIG. 4B is a block diagram schematically illustrating a typical thin film PV cell 410. The typical PV cell 410 includes a glass substrate 411 through which light can pass. Disposed on the glass substrate 411 are a first electrode layer 412, a PV active layer 401 (shown as comprising amorphous silicon), and a second electrode layer 413. The first electrode layers 412 can include a transparent conducting material such as ITO. As illustrated, the first electrode layer 412 and the second electrode layer 413 sandwich the thin film PV active layer 401 therebetween. The illustrated PV active layer 401 comprises an amorphous silicon layer. As is known in the art, amorphous silicon serving as a PV material may comprise one or more diode junctions. Furthermore, an amorphous silicon PV layer or layers may comprise a p-i-n junction wherein a layer of intrinsic silicon 401*c* is sandwiched between a p-doped layer 401*b* and an n-doped layer 401*a*. A p-i-n junction may have higher efficiency than a p-n junction. In some other embodiments, the PV cell can comprise multiple junctions.

Figure 4C:
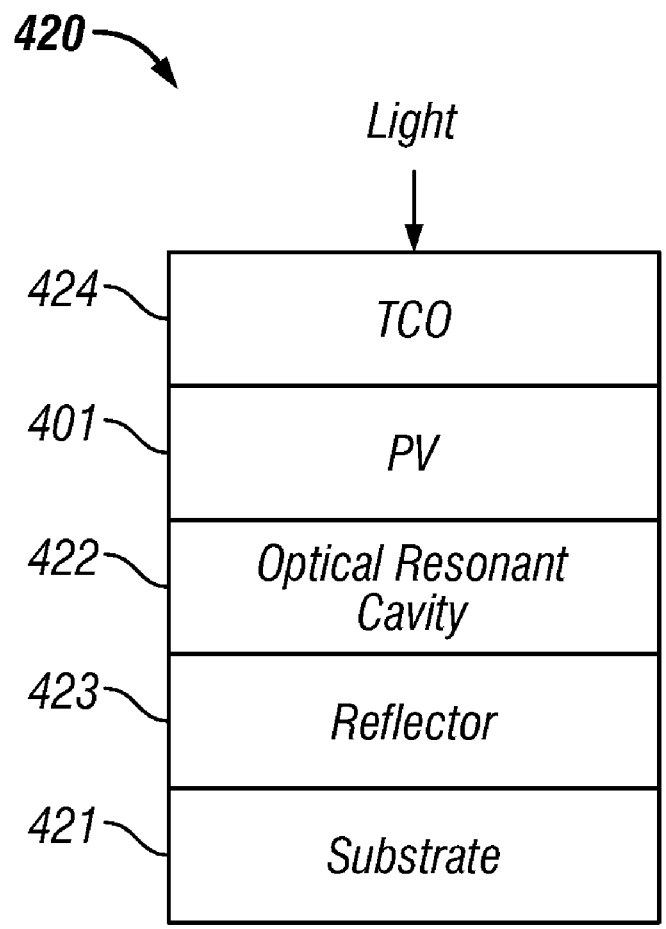
FIG. 4C is a block diagram that schematically illustrates a photovoltaic cell comprising an interferometrically enhanced photovoltaic stack.

FIG. 4C depicts an example of an interferometrically enhanced PV stack or cell 420. The interferometrically enhanced PV cell 420 includes a PV active material or layer 401. The PV active layer 401 may comprise a thin film photovoltaic material formed over a substrate 421. An optical resonant cavity 422 and a reflector 423 disposed below the PV active layer 401 are configured to interferometrically enhance the strength of the electric field in the PV active layer 401, resulting in an interferometrically enhanced PV cell 420 with improved efficiency. The PV active layer 401 may be covered in some areas with an opaque electrode (not shown) to facilitate the conduction of electrons and/or holes out of the PV active layer 401. The PV active layer 401 may also be covered with a transparent conducting oxide (TCO) layer 424, or both a TCO layer and an electrode. Similarly, the optical resonant cavity 422 may comprise a TCO layer that serves both as a part of an optical resonant cavity 422 as well as a conducting layer for holes and/or electrons to conduct out of the PV active layer 401. The PV active layer 401 may comprise a thin film photovoltaic material, such as amorphous silicon, CIGS or other thin semiconductor film photovoltaic material. The optical properties (dimensions and material properties) of the reflector 423 and optical resonant cavity 422 are selected so that reflection from interfaces of the layered PV device 420 coherently sum to produce an increased field of a suitable wavelength distribution and phase in the PV active layer 401 of the photovoltaic cell where optical energy is converted into electrical energy. Such interferometrically enhanced photovoltaic devices increase the absorption of optical energy in the active region of the interferometric photovoltaic cell and thereby increase the efficiency of the device. In variations on this embodiment, multiple optical resonant cavities can be employed to separately tune different wavelengths of light and maximize absorption in the PV active layer(s). The buried optical resonant cavities and/or layers may comprise transparent conductive or dielectric materials, air gaps, or combinations thereof.

Figure 4D:
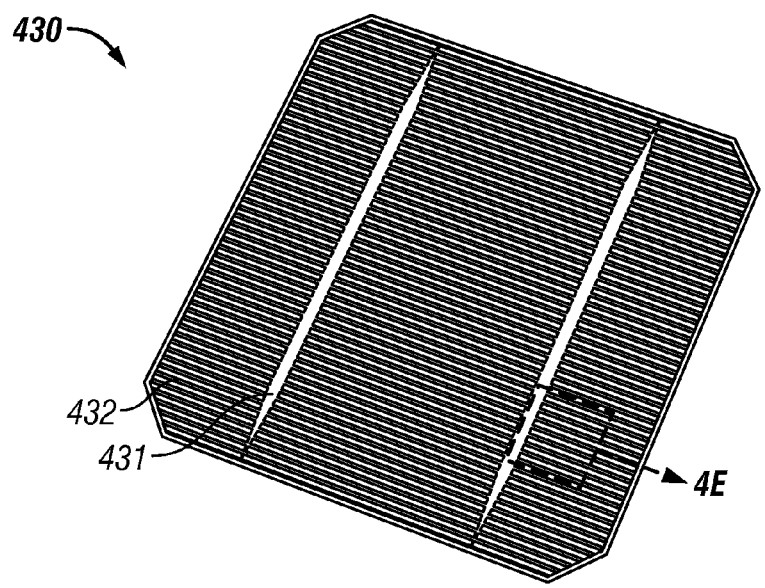
FIGS. 4D and 4E are schematic plan and isometric sectional views, respectively, depicting an exemplary solar photovoltaic device with visible reflective electrodes on the front side.
Figure 4E:
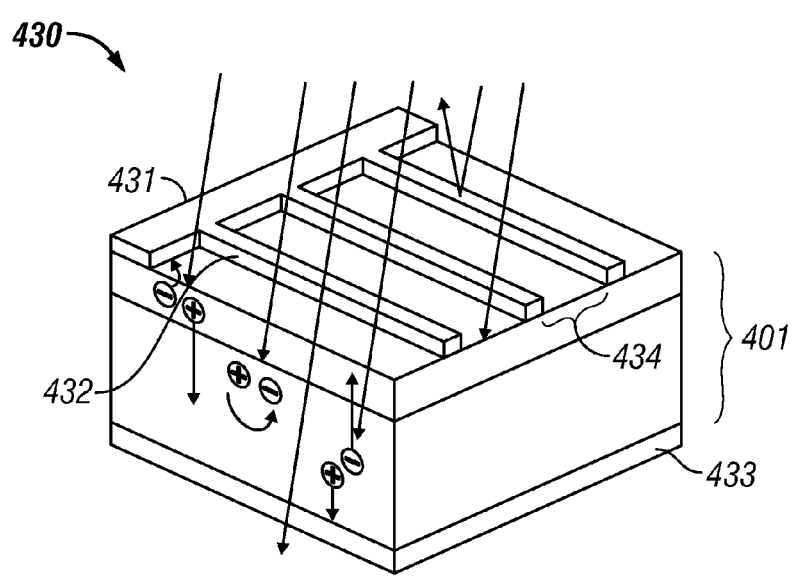

FIGS. 4D and 4E illustrate a PV device 430. As illustrated, the PV device 430 comprises front electrodes 431, 432 formed over a semiconductor wafer, such as a silicon wafer. However, as will be appreciated from descriptions below, other PV devices may comprise a thin film photovoltaic material. PV devices including either thin film or wafer-type PV material can be interferometrically-enhanced (see FIG. 4C and attendant description). As illustrated in FIGS. 4D and 4E, many PV devices employ specular or reflective conductors on a front, or light-incident, side of the device as well as on a back side of the PV device 430. Conductors on the front or light-incident side can comprise bus electrodes 431 or gridline electrodes 432. When optical energy is absorbed by the PV active material 401, electron-hole pairs are generated. These electrons and holes can generate current by moving to one or the other of the front electrodes 431, 432 or back electrodes 433, as shown in FIG. 4E. The front conductors or electrodes 431, 432 are patterned to both reduce the resistance of the path an electron or hole must travel to reach an electrode while also allowing enough light to pass through to the PV active layer 401. The patterns of the front electrodes 431, 432 may include windows 434 to allow incident light to transmit to PV active material 401. While the PV device 430 is illustrated with front conductors or electrodes 431, 432 patterned and back electrodes 433 as unpatterned, those of skill in the art will understand that the back conductors or electrodes may also be patterned in a different manner. The front and back electrodes 431, 432, 433 may comprise reflecting metallic conducting material. In some embodiments, the front and back electrodes 431, 432, 433 may include transparent conductive materials such as ITO, or both transparent and reflective conducting materials.

Traditionally the appearance of PV cells is dictated by the material comprising the electrodes and PV active material of the PV cells. However as the use of PV cells becomes more ubiquitous and new applications for PV cells emerge, designing and manufacturing colored PV cells may become important. Such colored cells may increase visual appeal and add aesthetic value. For example, there has been a lot of interest in designing and manufacturing building integrated PV applications (BIPV). The ability to pattern or blanket color on PV devices can aid in the acceptance of PV cells deployed on rooftops and facades of buildings, billboards, cars, electronic equipment, apparel, shoes, and many other locations that get exposed to light. Not only do interferometric stacks, such as IMODs (absorber-cavity-reflector stacks) and dichroic pair stacks, provide an ability to produce durable, fade-resistant color, but they have the additional advantage of producing a desired intensity and attractive color while still permitting design selection of the degree of light transmission through the interferometric stack.

Alternative methods to incorporate color into a PV cell are to add dyes or pigment of the appropriate color or add colored material in the PV stack. High absorption of light by such tinting, however, reduces the efficiency of the PV cell. Moreover, the colors have a tendency to fade in a shorter time than the lifespan of the PV device, particularly since the devices are often meant to be constantly exposed to sunlight.

Accordingly, the embodiments below describe "coloring" a PV cell by incorporating or integrating interferometric stacks, such as IMODs or dichroic pairs, with PV cells or devices. Using an interferometric stack on a PV device may allow for the appearance of a color reflecting from the interferometric stack hence imparting a "color" to the PV cell or device. Since the color of the reflection from an IMOD can be selected by using optical resonant cavities of appropriate thickness and material (index of refraction), as well as by selecting and using appropriate thicknesses and materials for absorbers and reflectors, an IMOD incorporated with a PV cell or device can be configured to reflect colors as desired for any particular application. Advantageously, the interferometric color reflecting effect is governed by the thickness and material(s) of the optical resonant cavity as well as the thickness and material(s) of the reflector and absorber materials. Accordingly, the color effect is not as susceptible to fading over time compared to common dyes or paints. Similarly, dichroic pairs of optical thin films can be configured to enhance reflection of a desired color with the added benefit of practically no absorption, allowing maximum transmission for a desired reflected color and intensity, in exchange for the expense of forming many layers.

Figure 5:
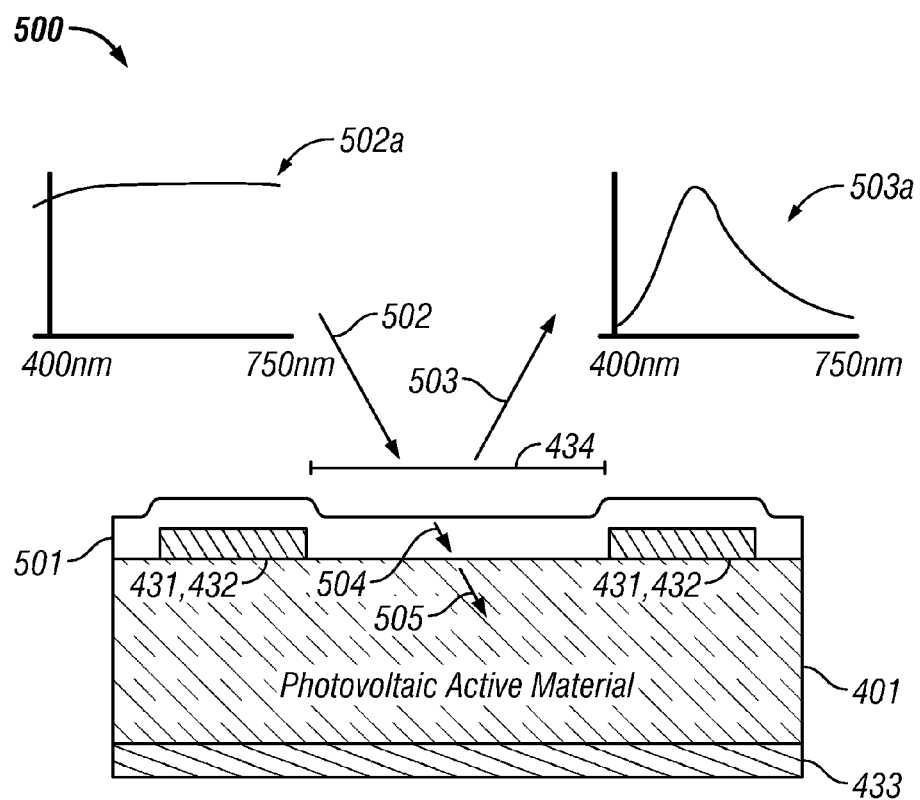
FIG. 5 schematically illustrates an embodiment of a color photovoltaic (PV) device incorporating an interferometric stack.

FIG. 5 illustrates an embodiment of a PV device incorporating an interferometric thin film 501 stack to reflect a color. The PV device 500 comprises a photovoltaic (PV) active material 401. In the illustrated embodiment, the interferometric stack 501 covers a front side of the photovoltaic active material 401. In various embodiments, the interferometric stack 501 may comprise different interferometric structures such as IMODs (absorber-cavity-reflector stack) or dichroic pair stacks, as will be clear from the description of FIGS. 6A-6E below. The illustrated front side interferometric stack 501 is transflective (i.e., simultaneously transmissive and reflective) and may be configured to reflect enough light so as to impart a color, yet transmit sufficient light so as to generate electricity. In dichroic pair embodiments, any light not reflected is transmitted. In absorber-cavity-reflector stacks, the reflector may be formed sufficiently thin so as to be a partial reflector with sufficient transmission to the PV active material 401. A light ray 502 incident upon the interferometric stack 501 may be characterized as having a spectral distribution 502a that expresses the various wavelength components present in light ray 502. As illustrated, light ray 502 comprises a broad spectrum of wavelengths in the visible range, from 400 to 750 nm and may hence represent light incident from an ambient white light source such as the sun or artificial man-made lighting. Ray 502 incident upon PV device 500 is partly reflected by the interferometric stack 501, as indicated by ray 503, and partly transmitted in rays 504 and 505. The interferometric stack 501 is configured to interferometrically enhance reflections of one or more wavelength spectra within a visible range of wavelengths. Therefore, reflected ray 503 may also be characterized as having a spectral distribution 503a. The spectral distribution may comprise one or more wavelength spectra or ranges such that the reflected ray 503 has a relatively high intensity of one or more wavelengths of light compared to others in the visible range. As a result of the selective enhancement of one or more wavelengths in reflected ray 503, a viewer viewing the PV device 500 from the light incident side will perceive a coherent color to the interferometric stack 501, and hence, the PV device 500.

As noted above with respect to FIG. 4E, some embodiments of PV cells or devices include front or back electrodes as well as windows 434 patterned to allow transmission of light to the photovoltaic active material. As shown in FIG. 5, light ray 502 incident within the window region 434 may be transmitted through the interferometric stack 501 along rays 504 and 505. The interferometric stack can be configured to both enhance reflection of some portion of the light so as to impart a color appearance while still transmitting substantial portions of incident light 502, as represented by a transmitted ray 505.

Conventionally, it is considered advantageous to minimize reflections from the front side of a PV device. Hence, as shown in FIG. 4A, a PV device 400 may comprise an anti-reflective coating 404 in front of the PV active material 401. Contrary to this typical effort, a PV cell incorporating an interferometric stack in order to reflect a particular color deliberately enhances the reflection of some wavelengths of light, thereby reducing efficiency. However, there is a tradeoff between the efficiency and the aesthetic appeal of a PV cell which reflects colors matching the surrounding environment in various applications, such as buildings, signs, or billboards. In some embodiments, the reflectivity of visible light reflected out of the interferometric stack 501, including portions over the front side of the window 434 exposing the PV active material 401, is greater than 10%. In other embodiments, it is greater than 15%, relative to visible incident light. In these embodiments, at least 10% or 15% of the incident visible light is lost in addition to any losses due to absorption in the interferometric stack 501. However, this may be acceptable due to the aesthetic advantages of a PV device 500 with an interferometric stack 501 and consequent more widespread acceptance may lead to overall greater capture of solar energy. Advantageously, dichroic pair stacks have low absorption and may therefore be more efficient for PV conversion. Hence in applications where high peak reflectance (e.g., 80% or more at peak) is desired, dichroic pairs may be preferable since they may have lower absorption losses. However, dichroic pair stacks may be more expensive, as they may comprise more layers than an IMOD, which at a minimum calls only for an absorber and an optical resonant cavity.

In various embodiments of the invention, the light reflected in ray 503 may have various characteristics depending on the optical properties of the optical thin films, or optical interference cavities as well as absorbers and reflector layers, within the interferometric stack 501. Hence, ray 503 may have a spectral distribution 503a that is different than the spectral distribution of the incident light 502a. Spectral distribution 503a of the light reflected out of the interferometric stack is not flat within the visible range of wavelengths. That is, in some embodiments, the spectral distribution 503a comprises one or more peaks corresponding to one or more peak wavelengths at which reflectance is higher than for other wavelengths. The peak(s) result in a particular colored appearance, against the background of depressed reflectivity of other visible wavelengths. In some embodiments, the reflectivity or reflectance at a peak wavelength may be much higher than the overall visible reflectivity. In such embodiments, the peak reflectance may be as high as 20% to 95%. The distribution will also comprise wavelengths near the peak wavelength at which reflectance is relatively high, but not as high as the reflectance at peak wavelength. The reflectivity at the peak(s) may therefore be characterized by bandwidths, such as half-peak bandwidths. The half-peak bandwidth for a reflectivity spike is the width of the band at a reflectance equal to half the reflectance at peak wavelength. In some embodiments, the half-peak bandwidth of a peak or spike in the reflected wavelength spectra is equal to or less than 150 nm. Particularly, the half-peak bandwidth of a spike in the reflected light distribution may be between 50 nm and 100 nm. In some embodiments, the spectral distribution of the reflected light comprises a single peak. In other embodiments, the spectral distribution may comprise multiple spikes or pulses centered around multiple reflectance peaks, each peak corresponding to a peak wavelength.

The PV active material or layer 401 may comprise a deposited thin film, or can be formed by portions of single crystal, semiconductor substrates and/or epitaxial layers thereover. A deposited thin film PV active material can comprise, for example, an amorphous silicon thin film, which has recently been gaining in popularity. Amorphous silicon as thin films can be deposited over large areas by physical vapor deposition (PVD), chemical vapor deposition (CVD), electrochemical vapor deposition, or plasma-enhanced chemical vapor deposition (PECVD), among other techniques. As is known by those with skill in the art, PV active materials comprising amorphous silicon layers may include one or more junctions with n-doped and/or p-doped silicon and may further comprise p-i-n junctions. The PV active material 401 may comprise other appropriate materials, including germanium (Ge), Ge alloys, and alloys like copper indium gallium selenide (CIGS), cadmium telluride (CdTe), as well as III-V semiconductor materials, or tandem multi-junction photovoltaic materials and films. III-V semiconductor materials include such materials as gallium arsenide (GaAs), indium nitride (InN), gallium nitride (GaN), boron arsenide (BAs). Semiconductor alloys like indium gallium nitride may also be used. Other photovoltaic materials and devices are also possible. Methods of forming these materials are known to those having skill in the art. As an illustrative example, alloys like CIGS can be formed by a vacuum-based process where copper, gallium, and indium are co-evaporated or co-sputtered then annealed with a selenide vapor to form the CIGS structure. Non-vacuum-based alternative processes are also known to those of skill in the art.

Figure 6A:
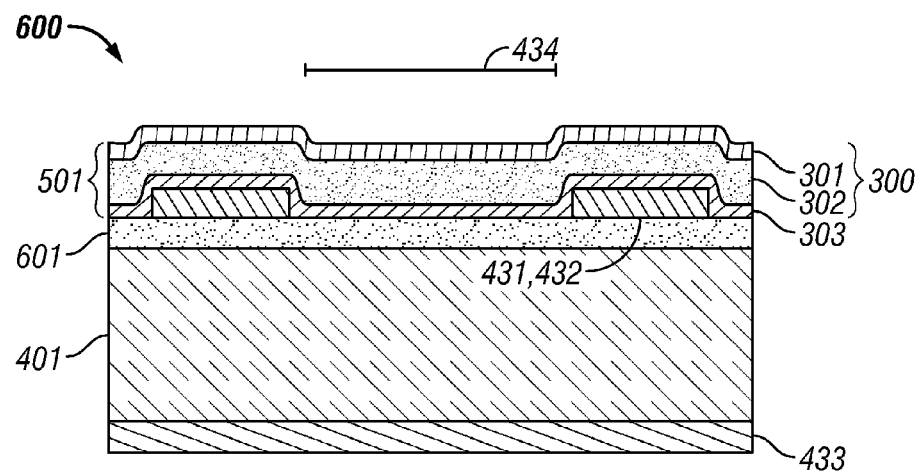
FIG. 6A illustrates a color PV device with an embodiment of a front side interferometric stack in the form of an IMOD comprising an absorber-cavity-reflector stack.

FIG. 6A depicts a PV device 600 with a photovoltaic active material covered with an interferometric stack 501 on the front side of the PV device 600. In the illustrated embodiment, the interferometric stack 501 comprises an interferometric modulator (IMOD) 300, including an absorber 301, optical resonant cavity 302, and a reflector 303. In the illustrated embodiment, in order to maximize transmission through the IMOD 300 to the PV material or PV active layer 401, the reflector 303 comprises a partial reflector. In other embodiments, the IMOD 300 may only comprise an absorber 301 and an optical resonant cavity 302 (see FIG. 6B). In such embodiments, in place of the partial reflector 303, the reflector function may be served either by front conductors 431, 432 in some regions and by the PV active material layer 401 and/or layers stacked with it (e.g., a TCO layer) in open or window regions 434. In some such embodiments, the PV active layer 401 or layer stack may be considered a "composite" partial reflector for the IMOD 300.

In some embodiments, the IMOD 300 for the color PV device 600 may be formed on a pre-fabricated PV cell or PV device. In such an embodiment, the PV cell may already have electrodes deposited, and may typically comprise the PV active layer 401, and one or more layers disposed over the PV active layer 401, as well as the front conductors 431, 432. In the embodiment of FIG. 6A, an overlying layer 601 may comprise a transparent conductor like a transparent conducting oxide (TCO), such as ITO. TCO layers are often used with photovoltaic materials, particularly thin film photovoltaic materials, in order to improve electrode contact to the PV active layer 401 without blocking light in the window regions 434. Functionally the TCO forms a part of the front electrodes 431 completing a circuit for carrying current generated by the PV active material 401, but conventionally the more conductive metal conductors that overlie the TCO and connect the PV cell to a wider circuit are referred to as the front electrodes. As known to those with skill in the art, a common TCO is indium tin oxide (ITO). Methods of forming or depositing ITO are well known in the art and include electron beam evaporation, physical vapor deposition, or sputter deposition techniques. Other TCO materials and processes of manufacture may also be used. The TCO layer can be omitted in other embodiments. Overlying layer 601 may comprise multiple layers and may optionally also comprise other materials designed to serve suitable optical, electrical, and/or mechanical purposes such as passivation or anti-reflection coatings. Alternatively, the IMOD 300 may be formed as a part of a single process in the manufacture of color PV device 600. In either case, IMOD 300 may be formed over the photovoltaic active layer 401 after the photovoltaic active layer and the front electrodes 431, 432 have been formed.

The IMOD 300 in the PV device 600 may therefore then be formed by depositing or forming a partially reflecting layer to form a reflector 303. The reflector 303 may be formed of a specular or reflective metal, for example, aluminum (Al), molybdenum (Mo), zirconium (Zr), tungsten (W), iron (Fe), gold (Au), silver (Ag), and chromium (Cr) or an alloy of the foregoing, such as MoCr. For the front side IMOD 300 of FIG. 6A, the reflector 303 is a partial reflector designed to reflect enough light to allow for enough interferometric effect to result in a desirable color reflected from the interferometric stack, while also allowing considerable light to transmit to the PV active material 401. In these embodiments, the partial reflector may be as thin as 20 Å, and as thick as about 300 Å. As is known to those of skill in the art, methods for forming very thin partially reflective layers from metals include physical vapor deposition. Other techniques for forming the partial reflector 303 are possible. In some embodiments, the partial reflector 303 can be non-metallic.

Referring again to FIG. 6A, an optical resonant cavity 302 is then deposited formed over the partial reflector 303. The optical resonant cavity 302 of one embodiment is formed by a layer of $SiO_2$ or other transparent dielectric material. In one embodiment, the optical resonant cavity 302 may be partly or fully formed by an air gap (see FIG. 6D). In such an embodiment, a suitable thickness for an air gap optical resonant cavity 302 may be between 42 nm and 700 nm to interferometrically produce the range of colors within the visible range of wavelengths. For materials other than air having an index of refraction (n) equal to $n_o$, the optical resonant cavity 302 may have a gap between $(42/n_o)$ nm and $(700/n_o)$ nm. Hence a suitable thickness for a $SiO_2$ (n=1.5 or similar index) optical resonant cavity 302 can be between about 30 nm and 500 nm to produce an intense interferometric color within the visible range. While interferometric effects can also be obtained with greater optical depth, the skilled artisan will appreciate that colors begin to wash out with greater depth as the optical distances correspond to multiples of a variety of wavelengths. Hence interferometric effects may be obtained by optical resonant cavities ranging anywhere from 10 nm to 3000 nm (air). Methods of depositing or forming $SiO_2$ are known in the art, including CVD as well as other methods. Other suitable transparent materials for forming the optical resonant cavity 302 include ITO, $Si_3N_4$, and $Cr_2O_3$. Use of a transparent conductor in the optical resonant cavity can obviate a separate TCO to improve front electrode contact across the window region 434.

In other embodiments, the IMOD 300 may be configured to reflect light in the infrared (IR) or ultraviolet (UV) range. In such embodiments, the optical resonance cavity 302 may be equal to one half of the wavelength of interest ($\lambda_o$. Hence, for example, for an IR wavelength of 1200 nm, the optical resonance cavity 302 height or thickness equals about 600 nm, for an air filled optical resonant cavity 302, or equivalent $[\lambda_o/(2*n_o)]$ for different index $(n_o)$ material as explained above.

Referring to FIG. 6A again, an absorber 301 is formed over the optical resonant cavity 302. The absorber 301 may comprise, for example, semitransparent thicknesses of metallic or semiconductor layers. The absorber layer may also comprise materials that have a non-zero n*k, i.e., a non-zero product of the index of refraction (n) and extinction coefficient (k). In particular, chromium (Cr), molybdenum (Mo), titanium (Ti), silicon (Si), tantalum (Ta) and tungsten (W) all form suitable layers. In one embodiment the thickness of the absorber 301 is between 20 Å and 300 Å.

Figure 6B:
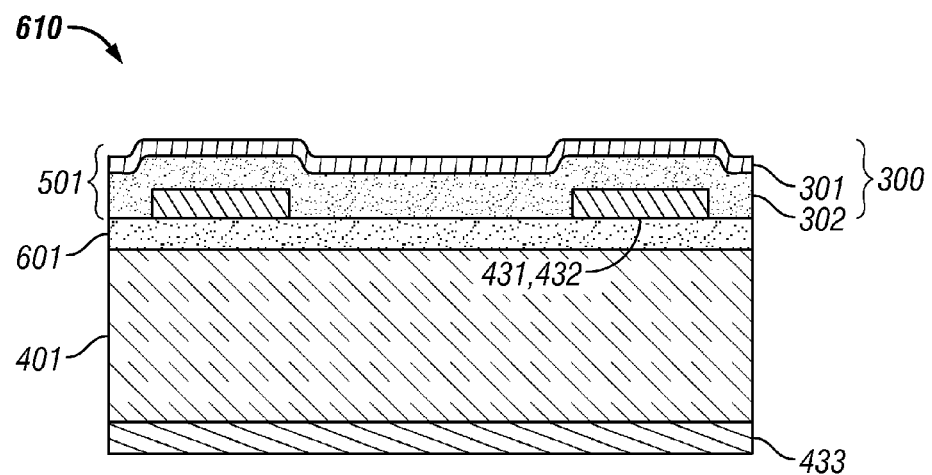
FIG. 6B illustrates an embodiment of a color PV device with a front side IMOD having only an absorber-cavity stack.

FIG. 6B depicts an embodiment of an interferometric stack 501 formed by an IMOD 300 without a partial reflector 303. In this embodiment, the PV active layer 401 as well as any layers below (not shown) or above (such as the overlying layer 601) may together serve as a composite partial reflector. In such embodiments, this partial composite reflector serves the function of the partial reflector 303 in FIG. 6A. In particular, a stack, including the PV active material 401, may serve as a composite reflector. In other embodiments, the PV active layer 401 may comprise an interferometrically enhanced PV stack (as described with respect to FIG. 4C). In such an embodiment, the individual layers in an interferometrically enhanced PV stack may be configured such that the stack reflects visible light sufficiently for the IMOD 300 to produce the desired color effect.

Figure 6C:
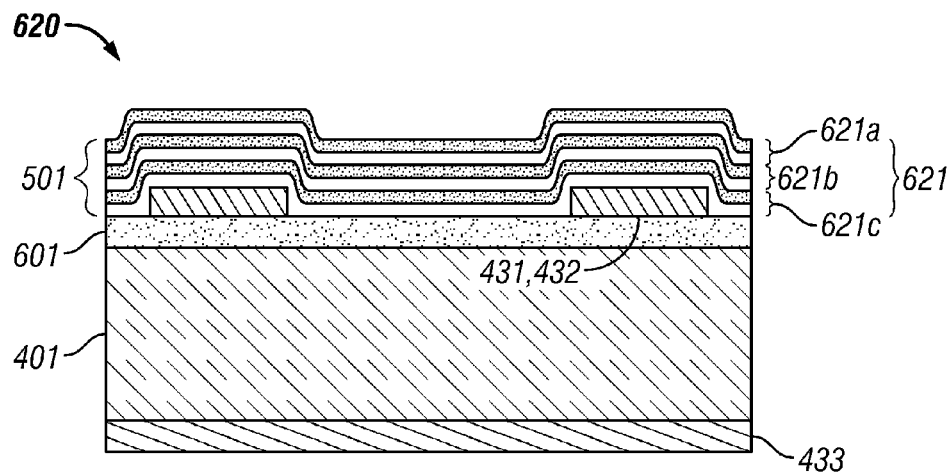
FIG. 6C illustrates a color PV device with an embodiment of a front side interferometric stack in the form of a stack of dichroic pairs.

FIG. 6C depicts a PV device 620 with a photovoltaic active material 401 covered with an interferometric stack 501, wherein the interferometric stack 501 is formed by a dichroic pair stack 621. One advantage of the integration of dichroic pairs 621 with photovoltaic materials, cells, or devices, is that dichroic pairs may comprise materials with little or no absorption. This means that with dichroic pairs most of the light is either reflected to generate a reflected color, or transmitted to the photovoltaic active material to generate electricity. As illustrated, the dichroic pair stack 621 comprises three dichroic pairs 621a, 621b, and 621c. However, the dichroic pair stack 621 may comprise as few as only one dichroic pair, and as many as 50 or more dichroic pairs. As discussed above with respect to FIGS. 2A and 2B, a single dichroic pair comprises two optical thin films with different indices of refraction. More specifically, the index of refraction of one optical thin film is higher than the index of refraction of the other optical thin film in the pair. Dichroic pairs may comprise a pair of optical films such as zinc sulfide (n=2.3) and magnesium fluoride (n=1.35), or titanium dioxide (n=2.4) and magnesium fluoride (n=1.35). Dichroic pairs may also comprise other dielectric materials such as silicon dioxide ($SiO_2$, n=1.5), chromium (III) oxide ($Cr_3O_2$, n=2.7), or silicon nitride ($Si_3N_4$, n=1.8). TCOs, such as indium tin oxide (ITO, n=1.7), or zinc oxide ($ZnO_2$, n=2.0) may also serve as optical thin films in a dichroic pair. Other optically transparent materials are also possible. As will be known to those of skill in the art, the precise index of refraction of any particular film will vary, according to properties of the material and the characteristics of the deposition technique. Hence, indices of refraction for thin films of the above materials may vary in practice from the values noted above. In situations where a conductive dichroic stack is required, dichroic pairs may comprise conductive transparent films.

As is known to those of skill in the art, dichroic pairs 621a, 621b, 621c may be suitably formed using techniques such as chemical vapor deposition as well as other techniques known in the art. In one embodiment, the thickness of each layer within the interferometric stack may be equal to one quarter of a wavelength of interest within the medium for a wavelength component of incident light. In other embodiments, the thickness of each layer may be equal to one half of a wavelength to be reflected from the dichroic stack 621. As will be clear to those of skill in the art, multiples of these thicknesses are also possible, although very thick layers will dilute or weaken the intensity of the peak reflected color from the dichroic stack 621, and or introduce subsidiary peaks to alter the color. Other thicknesses are also possible to maximize a particular interferometric effect (such as constructive versus destructive interference) at any particular wavelength. The optical thin films forming any single dichroic pair may be of equal optical path length, or they may be of differing optical path lengths. As noted previously, those of skill in the art will appreciate that even with equal optical path lengths, the physical thickness of optical thin films forming a dichroic pair will be different as the indices of refraction of the two optical thin films are different.

In general, within the visible range, the thickness of optical thin films forming dichroic pairs may range from about 30 nm thick to about 300 nm depending upon the particular interferometric effect at a particular wavelength sought. For reflections in the infrared or ultraviolet ranges, the thickness of optical resonant cavities may be equal to the wavelength of interest, divided by 4 times the index of refraction ($n_o$) of the optical film $[=\lambda/(4*n_o)]$.

In various embodiments, the dichroic stack 621 may comprise a single dichroic pair. In other embodiments, between 2 and 50 dichroic pairs are used. As is known to those of skill in the art, stacks comprising 30 or more dichroic pairs are common. Advantageously, an interferometric stack 501 comprising dichroic pairs typically absorb very little, allowing a straightforward trade-off between reflected color appearance and light conversion efficiency for the PV device, without additional absorbance losses in the interferometric stack 501. The use of such media allows for a large number of dichroic pairs, which improves the ability to configure the interferometric stack 501 to achieve desired reflection characteristics, such as reflectance at a particular wavelength or wavelengths. This is in contrast to an IMOD, where, generally, certain wavelengths of light will typically be absorbed, and therefore some optical energy is lost. However, the color characteristics of an IMOD may make it a preferable choice over a dichroic pair interferometric stack in certain applications, particularly where relatively rich color is desired from few layers. The color characteristics of a dichroic pair interferometric stack may be preferred in other applications, particularly over the front of PV active layers where high efficiency and therefore low losses are desired.

Figure 6D:
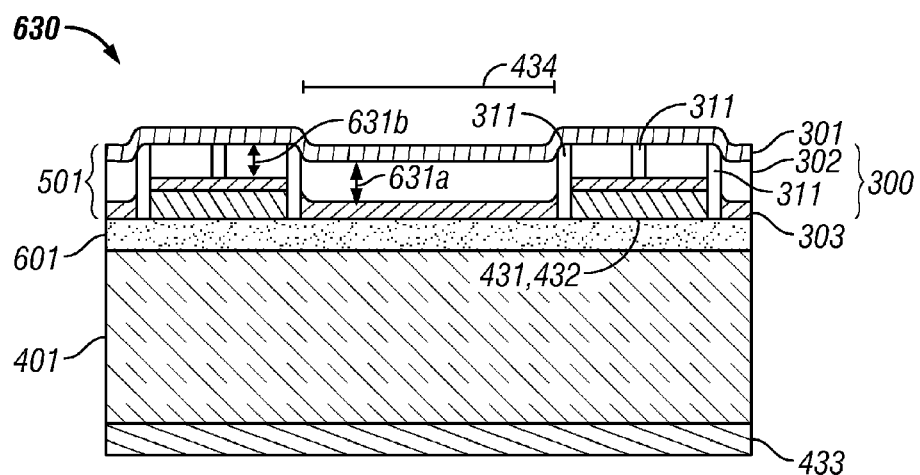
FIG. 6D illustrates an embodiment of a color PV device having a front side IMOD comprising an absorber-cavity-reflector stack, wherein the optical resonant cavity comprises an air gap.

FIG. 6D depicts a color PV device 630 having an interferometric stack 501 formed by an IMOD 300 in which the optical resonant cavity 302 includes an air gap. In this embodiment, the optical resonant cavity 302 comprises an air gap formed by supports 311 supporting absorber layer 301. As in the other embodiments, the optical resonant cavity 302 may have a height 631a in window region 434 that is the same or different than the height 631b of the cavity over the electrodes 431, 432. Hence the supports 311 may have varying heights as required. Supports 311 can take the form of pillars, posts, rails, rivets, etc. A suitable thickness for an air gap optical resonant cavity 302 may be between 30 nm and 500 nm to interferometrically produce the range of colors within the visible range of wavelengths. In some arrangements where the optical resonant cavity 302 comprises an air gap, the absorber 301 may be deformed or moved either by the application of a voltage across the absorber 301 and the partial reflector 303 for electrostatic operation, or by other means, such as by the application of pressure on absorber 301 or temperature.

Figure 6E:
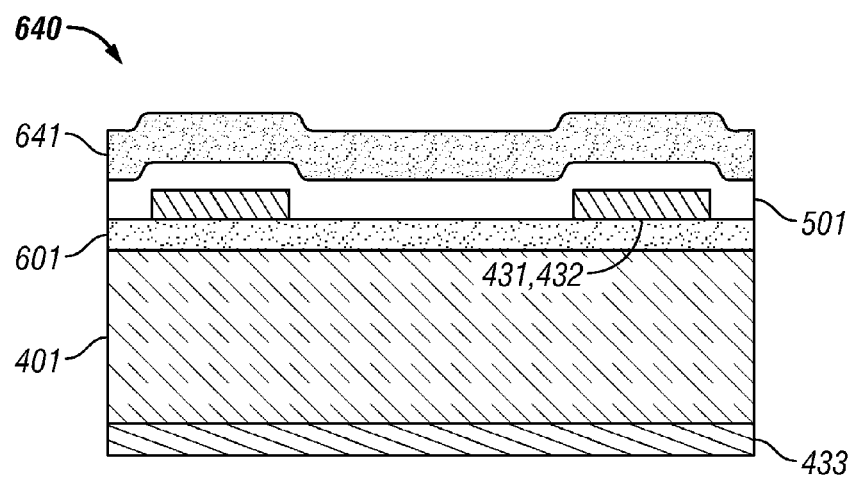
FIG. 6E schematically illustrates an embodiment of a color PV device having a front side interferometric stack with an additional layer over the IMOD.

FIG. 6E depicts an embodiment of the invention. The PV device 640 of FIG. 6E comprises an interferometric stack 501, which can be an IMOD or a dichroic stack, where the interferometric stack 501 is formed over a photovoltaic (PV) active layer 401. The illustrated embodiment further comprises an additional layer 641 over the interferometric stack 501. The additional layer 641 may comprise a diffuser, a passivation layer, a hard coat, and/or an antireflective (AR) coating. A diffuser may help to make the color or image reflected from the interferometric stack 501 more aesthetically pleasing or may help blend pixels to form a better image. A passivation layer may help protect the structures within the interferometric stack 501 or protect the PV active layer 401 electrically and/or mechanically. The additional layer 641 may comprise multiple layers, including a transparent substrate to form an interferometric stack laminate (see discussion of FIGS. 9A-9C below). An anti-reflective coating may help to reduce unwanted reflections.

Figure 9A:
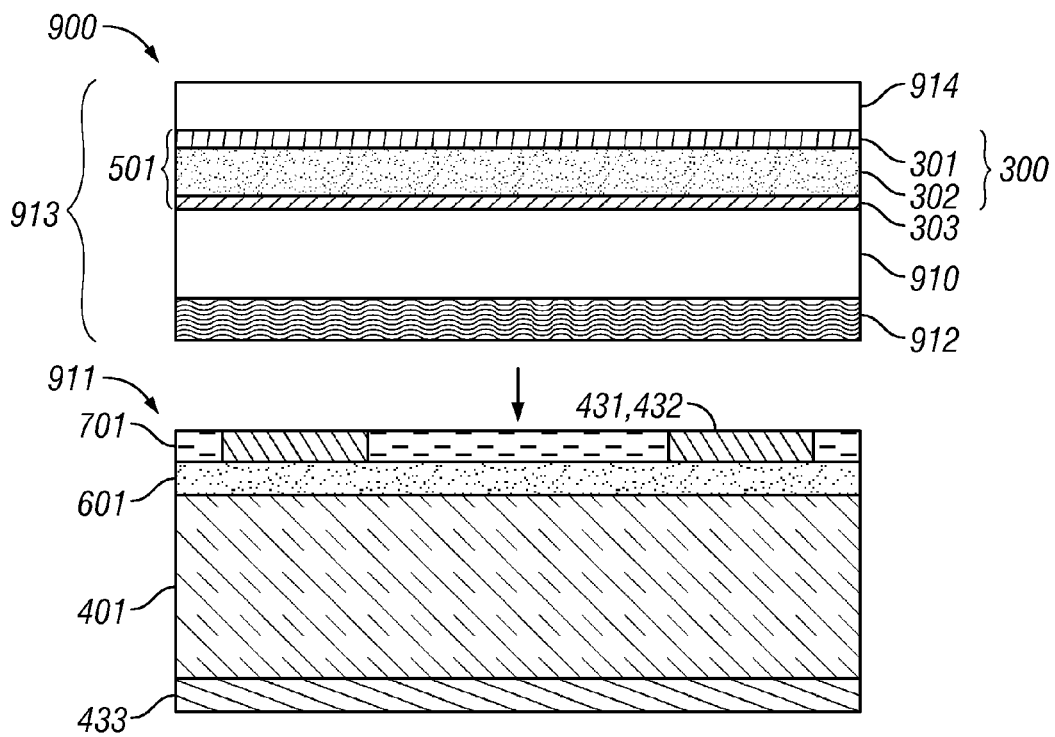
FIGS. 9A-9C illustrate embodiments of a method of integrating an interferometric stack by lamination with a color PV device, array or solar panel.
Figure 9B:
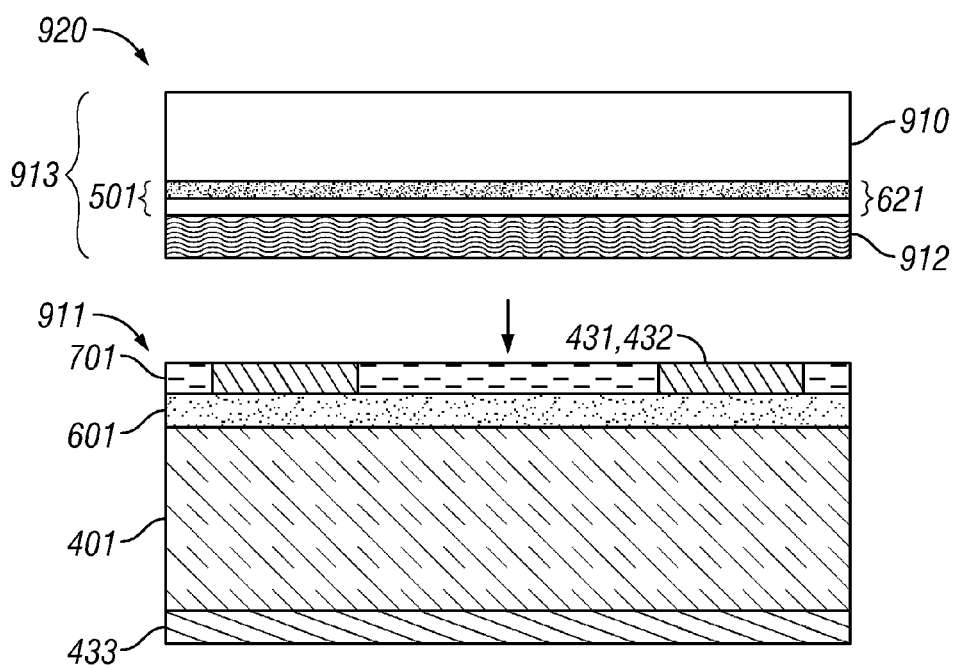
Figure 9C:
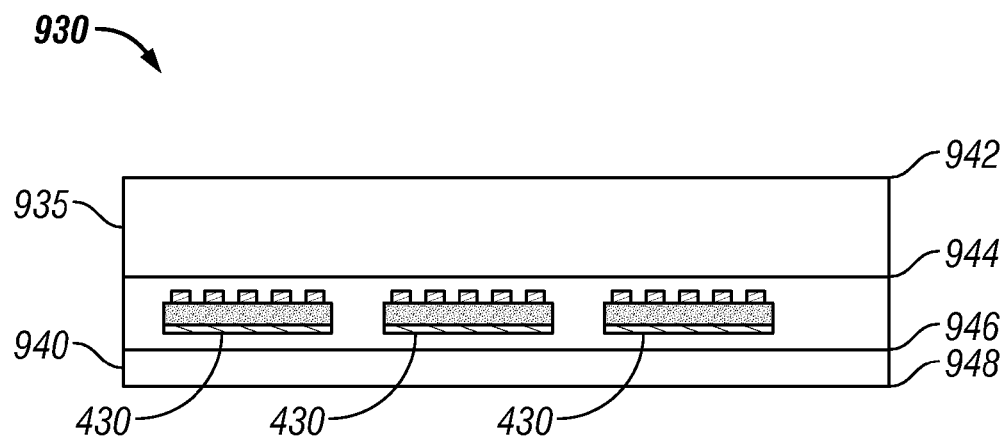

As the skilled artisan will readily appreciate, PV devices or cells are often electrically connected to form arrays using ribbons or tabs to connect the front conductors 431, 432 or the back conductors 433 of multiple PV devices or cells to each other (see FIG. 9C and attendant discussions). In such case, the interferometric stacks 501 depicted in FIGS. 6A-6E and/or additional layers 641 formed over the interferometric stacks 501 (e.g., passivation, AR, etc.) may be patterned to create an opening to allow for the soldering of a conducting ribbon onto the front or back electrodes 431, 432, 433 as required. Alternatively, the materials comprising the interferometric stacks 501 may be chosen to be electrically conductive, such as thin film metals or TCOs to allow for the soldering of conducting ribbons directly onto the interferometric stack. In other embodiments, the interferometric stacks may be laminated onto the surface of a PV device, cell, or array (see discussion with respect to FIGS. 9A-9C). In such embodiments, the lamination may be done after the soldering of the conducting ribbon, which may improve electrical connectivity between tabbed PV devices or cells.

Figure 7:
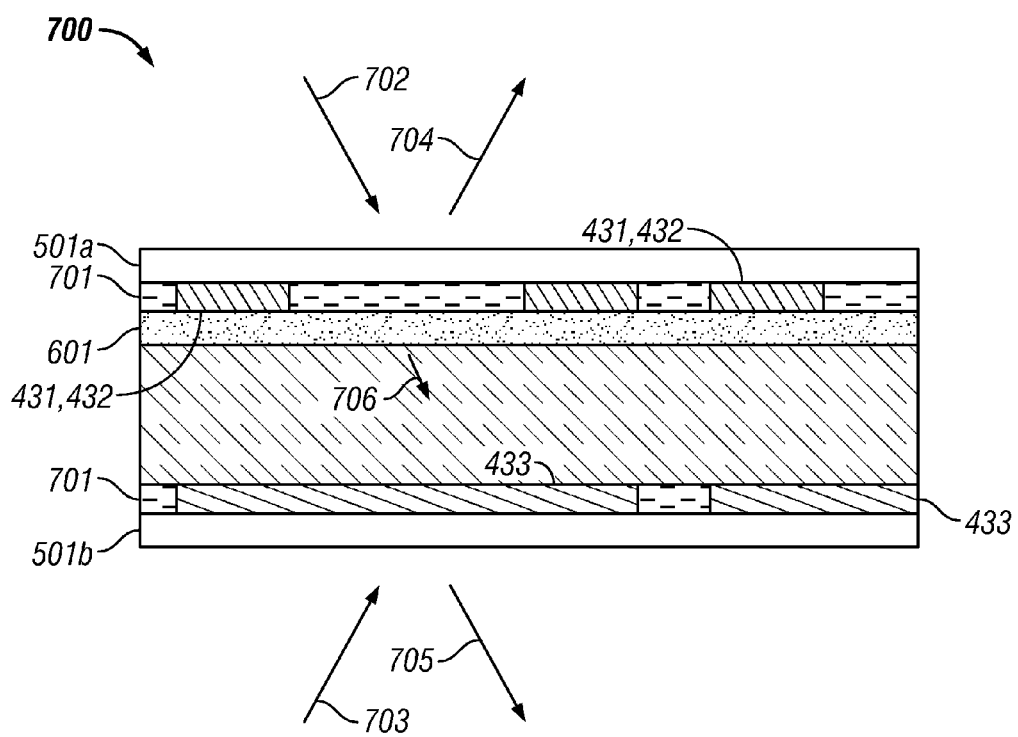
FIG. 7 schematically illustrates an embodiment of a color PV device having interferometric stacks on both a front side and a back side.

FIG. 7 shows an embodiment of a color PV device 700 with an interferometric stack 501a formed both over front conductors 431, 432, as well as an interferometric stack 501b over the back electrodes 433. As illustrated, the PV device 700 has patterned electrodes on both front as well as back surfaces. In other embodiments, the back electrodes 433 may be unpatterned and may be completely opaque. As illustrated, the interferometric stacks 501a, 501b are not contoured due to a planarization layer 701. The planarization layer 701 may be formed of any suitable material, preferably a light transmissive material to allow light incident 702 and 703 to reach the photovoltaic active material 403, although a partly transmissive material may also be used. Planarization methods are known to those of skill in the art.

In FIG. 7, incident rays 702, 703 are at least partly reflected as indicated by rays 704, 705 and partly transmitted along ray 706. Transmitted ray 706 may reach the PV material 401 and therefore generate electricity. The back electrode 433 is typically opaque. In such embodiments, ray 703 may be fully or nearly fully reflected in ray 705 As discussed above with respect to FIG. 5, the interferometric stacks 501a, 501b can be configured such that rays 704, 705 reflected from the interferometric stacks 501a, 501b comprise enhanced reflections of one or more peaks within a visible range of wavelengths. Therefore, the PV device 700 may display a color on both a front and a back side of the device. The selected colors reflected from front and back can be different. It will be appreciated that only the backside can be provided with an interferometric stack 501b in other embodiments. Interferometric stacks 501a, 501b may comprise dichroic pair stacks or absorber-cavity-reflector (IMOD) stacks. In embodiments where interferometric stacks 501a, 501b comprise IMODs, the reflector may be a partial reflector and hence partially transmissive for allowing light to reach the PV material 401 from either the front or the back side. In particular, in embodiments where the back electrode 433 is patterned, light may transmit through the partial reflector in gaps in the back electrode 433 pattern and reach the PV material 401.

As discussed above with respect to FIGS. 5-7, a color PV device may comprise an interferometric stack 501 disposed so as to cover a photovoltaic active layer. The interferometric stack 501 displays a color that depends upon on the configuration of the interferometric stack. In some embodiments, this color is uniform across the PV device. In other embodiments, the reflected interferometric color may vary across a PV device or across an array of PV devices. In such embodiments, a PV device or cell or an array of PV devices or cells may configure overlying interferometric stacks to form an image, such as for a display, sign, or a billboard. Other applications for a color PV device of non-uniform color may include architectural building applications, billboards, or any application where imparting a non-uniform color to a PV device or cell is desirable. Advantageously, color PV devices or cells can replace conventional signs, automobile surfaces, even clothing and shoes, and impart aesthetic colors while simultaneously deriving electrical energy from ambient light.

Figure 8A:
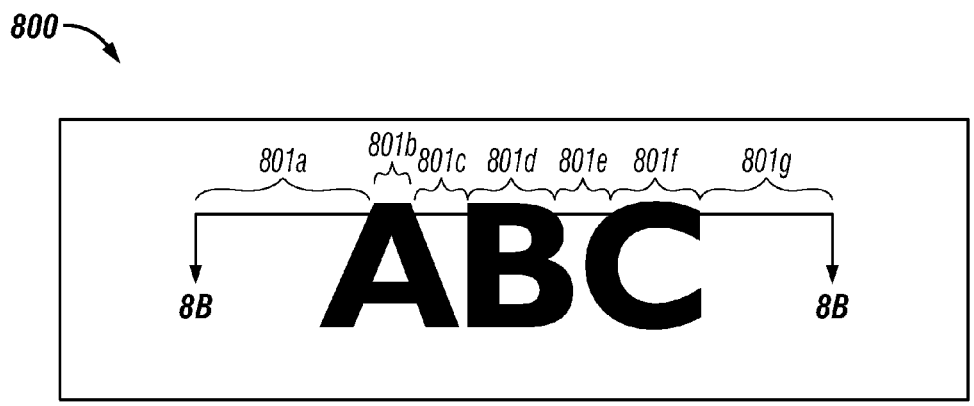
FIGS. 8A-8D illustrate embodiments of patterned interferometric stacks displaying different colors in different regions to form images over a static display comprising a color PV device.

FIG. 8A depicts an embodiment of a PV device with different reflected colors in different regions, configured to display a particular image, shape, information, or characters as in a display, sign, or billboard. In FIG. 8A, a static display 800 contains multiple regions 801a-801g of uniform color. For example, the background (regions 801a, 801c, 801e, and 801g along cross-section 8B) may be yellow, red, green, or white or black. The letters "ABC" (regions 801b, 801d, 801f in cross-section 8B) may be darker. For example, letters "ABC" may be blue.

Figure 8B:
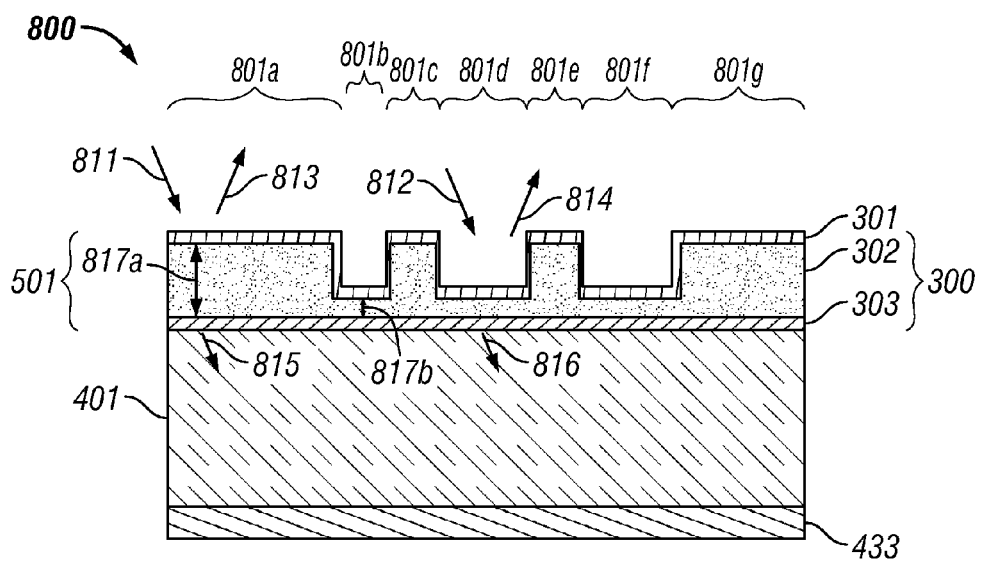

FIG. 8B shows a cross section of a PV display device 800. As shown in FIG. 8B, light rays 811 and 812 incident upon the interferometric stack 501 are partly reflected as indicated by rays 813, 814, and partly transmitted along rays 815 and 816. In the illustrated cross-section, the interferometric stack 501 comprises an IMOD 300 with an absorber 301, an optical resonant cavity, and a partial reflector 303. As shown in FIG. 8B, the height or thickness of the optical resonant cavity 302 is not uniform. The optical resonant cavity 302 is patterned such that the IMOD 300 comprises multiple regions 801a-801g with different resonant cavity heights corresponding to a different reflected color. As illustrated, the static display 800 comprises an optical resonant cavity 302 with two optical cavity heights corresponding to two different colors. However, the display 800 may comprise more than two heights and thus more than two reflected interferometric display colors. As shown in FIG. 8B, regions 801a, 801c, 801e, and 801g have a relatively large optical resonant cavity height 817a. On the other hand, regions 805b, 805d, and 805f have a smaller optical resonant cavity height 817b. These different heights are configured to result in reflections of different peaks (at different peak wavelengths) for reflected rays 813, 814. In this way, one region of the display will show one color, and another region will show a different color. In at least one of the regions, the IMOD 300 can be configured to reflect enough light so as to display a visible color, while also transmitting sufficient light to PV material 403 to generate electricity. Hence while incident rays 811 and 812 are partly reflected in rays 813 and 814, sufficient light may be transmitted in at least one of rays 817 and 818 to allow for the generation of an electrical current in the photovoltaic material 401. In FIG. 8B, no front electrodes are shown for simplicity. As will be appreciated by the skilled artisan, a PV display device 800 will comprise front electrodes that may be situated between the partially reflected layer 303 and the photovoltaic material 401. Similarly, those of skill in the art will appreciate that PV device 800 may comprise layers not shown here, such as anti-reflective coatings, diffusers, or passivation layers over the PV active layer 401 or interferometric stack 501. The PV device 800 may also comprise layers (not shown) such as a TCO layer functionally forming part of the front electrodes between the partial reflector 303 and the photovoltaic material 401. Also, the PV device 800 may comprise regions of continuous color variation, rather than distinct regions of uniform color. As will be readily appreciated by one of skill in the art, continuous color variation can be accomplished using IMOD 300 by continuously varying the height of the optical resonant cavity 302, absorber 301, or partial reflector 303.

Figure 8C:
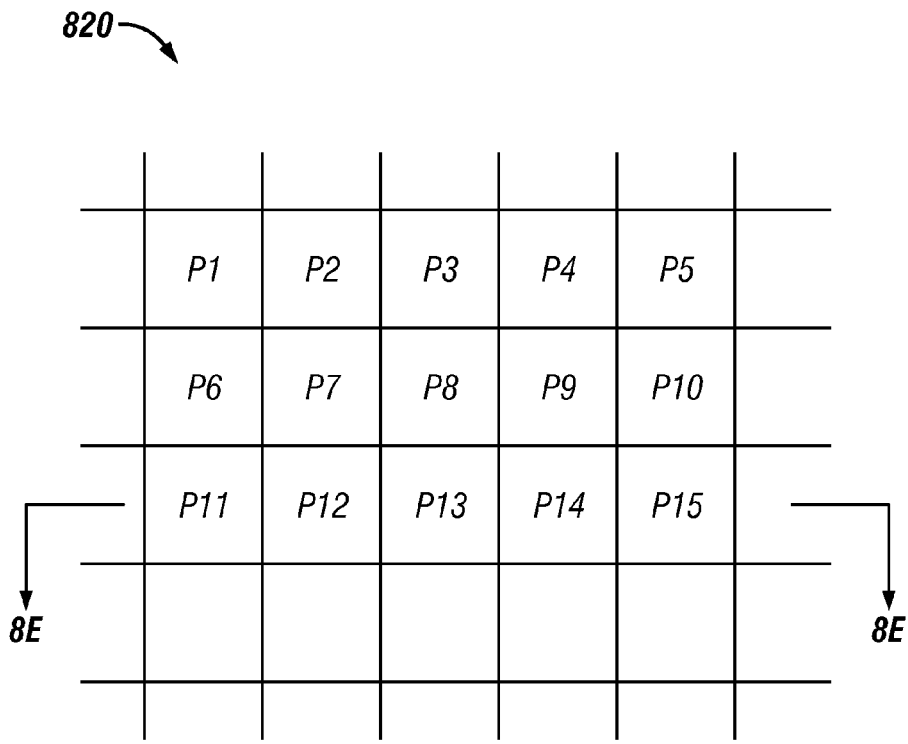
Figure 8D:
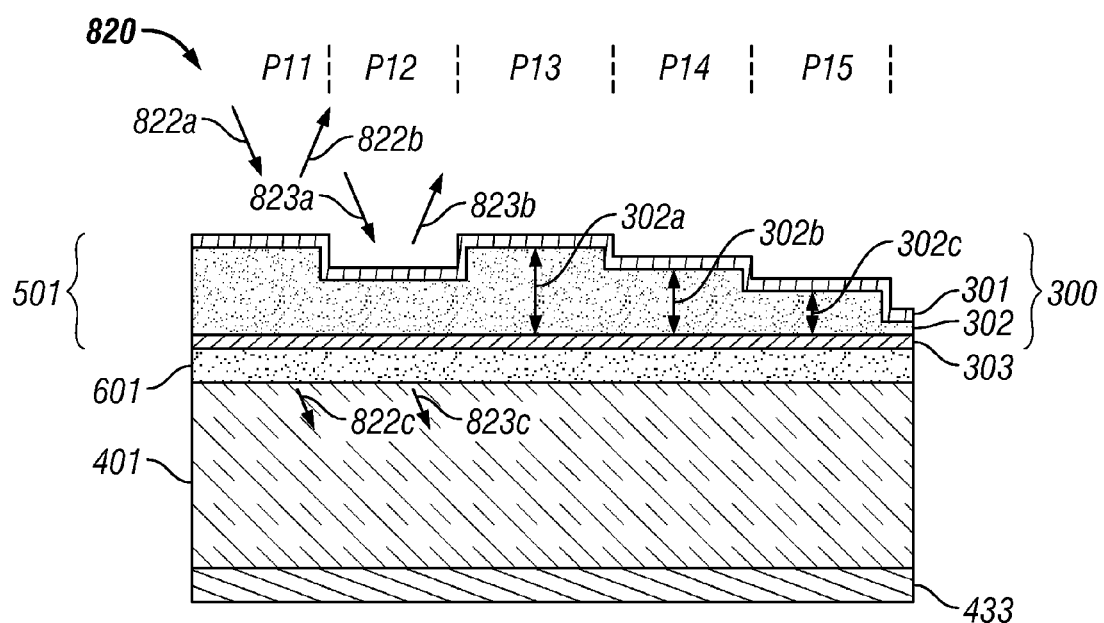

FIGS. 8C and 8D depict another embodiment of a PV display device 820. In FIG. 8C, the image or pattern displayed on the PV display device 820 is pixilated such that any image is made up of multiple pixels P1-P15. Hence the image or pattern comprises a regular array of pixels as shown in FIG. 8C. As will be appreciated by one of skill in the art, pixilation may be convenient for the transfer of digital images onto a static IMOD as shown in FIG. 8C. FIG. 8D is a cross-section of FIG. 8C showing an embodiment of a pixilated PV display device 820. As illustrated, an interferometric stack 501 comprises an IMOD 300 comprising an absorber 301, a static, variable height optical resonant cavity 302, and a partial reflector 303 patterned so as to form pixels. Each pixel P1-P15 may be formed by a region of a uniform interferometric sub-stack such that one pixel may be made up of a discrete absorber, optical resonant cavity, and partial reflector. For example, pixel P13 may be made up of the absorber 301, optical resonant cavity 302a, and partial reflector 303. The absorber 301, as well as optical resonant cavities 302b, 302c similarly form pixels P14 and P15 in the pixel array, respectively. As illustrated optical resonant cavities 302a, 302b, 302c may have different heights, resulting in different colored pixels. In other embodiments, such as in a region of uniform color, several adjacent optical resonant cavities may have roughly equal heights.

In an RGB scheme, pixels P1-P15 may comprise red pixels, green pixels, and blue pixels. More generally, a regular array of pixels may comprise a plurality of red pixels, a plurality of green pixels, and a plurality of blue pixels. Hence, for example, the optical resonant cavity 302a may form a red pixel, while optical resonant cavity 302b may form a green pixel, and optical resonant cavity 302c may form a blue pixel. Other color schemes are also possible, such as CMY (cyan, magenta, yellow), RYB (red, yellow, blue), and VOG (violet, orange, green), among others. As shown in FIG. 8D, the height of the optical resonant cavities 302a, 302b, 302c is primarily varied to vary color. However, the absorber 302 and reflector 303 thicknesses may also be varied from pixel to pixel, along with the optical resonant cavity thickness. This allows flexibility to have any desirable color (hue) and shade (saturation and lightness) in any pixel, as the height of any or all of the absorber 302, reflector 303, or the optical resonant cavity 302 can be tailored as necessary.

As shown in FIG. 8D, light rays 822a, 823a incident upon pixels P11, P12 in pixilated IMOD 300 are partly reflected as indicated by rays 822b, 823b and partly transmitted along rays 822c, 823c. Reflected rays 822b, 823b may contain different wavelength distributions and hence may reflect or display different colors depending upon the height or thickness of the optical resonant layer for pixels P11 and P12. As mentioned above, to allow for reasonable electricity generation, the IMOD 300 may be configured to reflect enough light to display a color while allowing sufficient light to transmit to the photovoltaic active layer 401 along rays 822c, 823c.

The variable height optical resonant cavity 302 in FIG. 8D may comprise a dielectric material such as silicon dioxide or other suitable optically transmissive or transparent medium. The optical resonant cavity 302 may comprise a conductor, such as a TCO or other transparent conducting material. Furthermore, in some embodiments, the optical resonant cavity 302 may comprise an air gap. In such an embodiment, supports 311 (see FIG. 6D) may help to form the air gaps.

As illustrated in FIGS. 8A-8D, the interferometric stack 501 comprises an IMOD 300 comprising an absorber 301, an optical resonant cavity 302, and a reflector 303. However, as will be clear to one of skill in the art, a similar effect may be accomplished using dichroic pairs as well. For example the different regions 801a-801g of FIG. 8A could be made to have different colors using dichroic pairs as discussed in FIGS. 2A-2E and FIG. 6C. For example, regions 801a-801g may have different numbers of dichroic pairs to create different color intensities in the various regions. In another embodiment, the optical thickness of the optical films comprising the dichroic pairs in regions 801a-801g may be varied so as to configure the dichroic pairs in the various regions to reflect a different wavelength peak or spike. The skilled artisan will appreciate, however, that multi-color patterns are easier and cheaper to produce with IMOD constructions as compared to dichroic stacks.

FIGS. 9A-9C depict methods for manufacturing color PV devices 900, 920, 930 involving lamination of elements including interferometric stacks. Typically, whether forming a blanket or solid color or a patterned image, the color interferometric stack(s) need not be precisely aligned with lateral patterns across the PV device. Accordingly, the interferometric stack(s) can be manufactured independently of the PV devices, such as on a coverplate (FIGS. 9A-9C) or a backplate (FIG. 9C), which is later laminated to a PV device to form the color PV device. Alternatively, the color interferometric stack can be formed on an outer surface of the coverplate or backplate after lamination.

FIG. 9A depicts an embodiment of a method of manufacturing an interferometric stack to cover a photovoltaic active layer 401 by way of a transparent substrate 910 which is laminated onto the surface of a PV device or cell 911. In FIG. 9A, the interferometric stack 501 comprises an IMOD 300 comprising a partial reflector 303, an optical resonant cavity 302, and an absorber 301. The IMOD 300 may be formed onto the transparent substrate 910 using techniques similar to those described above. The transparent substrate 910 may comprise glass, or other suitable optical substrate such as a highly transparent, flexible plastic. The substrate 910 may have an adhesive layer 912 on a side opposite the IMOD 300 to allow for adhesion onto the PV cell or device 911. The PV cell or device 911 may comprise front electrodes 431, 432 and may further comprise a planarization layer 701 of highly transmissive optical material to make a smooth planar surface with respect to the front conductors 431, 432 to aid in lamination. An additional film 914, such as a passivation layer, hard coat or AR coating, diffuser, etc., may be included above the IMOD 300. As indicated by the downward arrow, the laminate 913 may then be applied to the PV cell or device 911 to form the color PV device 900.

FIG. 9B illustrates an embodiment of manufacturing a color PV cell or device 920 wherein the optical substrate 910 faces away from the PV device 911. In FIG. 10B, the color interferometric stack 501 comprises dichroic pair(s) 621 formed on one side of substrate 910 using techniques and materials discussed previously. Additionally, in some embodiments an adhesive layer 912 may be formed on the dichroic pair(s) 621 to allow for adhesion to the PV device or cell 911. An additional layer or layers (not shown) may be formed between the dichroic pair(s) 621 and adhesive layer 912. As illustrated in FIG. 9B with the interferometric stack 501 comprising a single dichroic pair 621, it will be understood from the discussion of FIG. 6C above that the color interferometric stack 501 typically comprises a plurality of dichroic pairs.

For purposes of illustration, FIG. 9A shows an interferometric stack 501 formed by an IMOD 300 on the front side of the substrate 910, while FIG. 9B shows an interferometric stack 501 formed by dichroic pairs 621 on the back side of the substrate 910. The skilled artisan will readily appreciate that the positions of either type of color interferometric stack 501 can be reversed.

As illustrated in FIGS. 9A and 9B, an interferometric stack 501 is laminated onto the front side of a PV device 911. However, as will be clear to those of skill in the art, in some embodiments, the laminate 913 may be laminated onto the back side, e.g., over the electrode 433. In such embodiments, the back electrode 433 may be completely opaque. In other such embodiments, the back electrode 433 may be partly transmissive. In yet other such embodiments, the back electrode 433 may be patterned to comprise windows to allow light to transmit through or to the PV active layer 401.

FIG. 9C depicts an array 930, such as a solar panel, of PV devices 430 (see FIG. 4D). PV devices 430 may comprise PV cells or wafers. In the array 930, multiple PV devices 430 are bound together between a frontsheet or coverplate 935 and a backsheet or backplate 940. The coverplate 935 may be glass or any other optically transparent binding sheet. The multiple PV devices 430 may be electrically connected to each other using ribbons or tabs or other electrical connection so that PV devices 430 may be tabbed together to form a single electrical array 930 or panel. While the discussion in FIGS. 6A-6E on imparting color to a PV cell or device has concentrated upon imparting color to a single cell or device, interferometric stacks may also be used to impart color onto an entire array or solar panel such as array 930 by depositing or laminating (see FIGS. 9A and 9B) IMOD (absorber-cavity-reflector) films or optical thin film dichroic pairs. In particular, interferometric stacks may be deposited or laminated onto surfaces or at an upper interface 942 or a lower interface 944 of the coverplate 935 to produce color reflections on the front side. Alternatively, to form a color PV array 930 that reflects color on the back side, an interferometric stack may be deposited or laminated at an upper (inner) interface 946 or a lower (outer) interface 948 of the backplate 940. In embodiments where the interferometric stack comprises an IMOD (absorber-cavity-reflector) stack, the reflector may be a partial reflector to allow sufficient light to transmit to the PV cells 430. Hence, light may transmit through the entire stack depicted in FIG. 9C to allow light to transmit to the other side of the PV array 930 between the gaps formed between PV cells 430. Such transmission may be desirable in many applications, for example in a window or other architectural application. As discussed with respect to FIGS. 8A-8D, interferometric stacks applied over the entire array 930 may be blanket (uniform color), or patterned to form various regions of different color or pixels to form an image, may be transflective on the front or back sides, and may be opaque on the back side in some arrangements.

While the foregoing detailed description discloses several embodiments of the invention, it should be understood that this disclosure is illustrative only and is not limiting of the invention. It should be appreciated that the specific configurations and operations disclosed can differ from those described above, and that the methods described herein can be used in contexts other than fabrication of semiconductor devices. The skilled artisan will appreciate that certain features described with respect to one embodiment may also be applicable to other embodiments. For example, various features of an interferometric stack have been discussed with respect to the front side of a photovoltaic cell, device or array, and such features are readily applicable to an interferometric stack formed over a back side of a photovoltaic cell, device or array. For example, various reflector features have been discussed with respect to various embodiments of IMODs formed over a front side of a PV device. Such reflector features are also applicable to IMODs formed over a back side of a PV device, including the use of partial reflectors, or the omission of a reflector while using the back electrodes as a reflector for some embodiments of an IMOD.

We claim:
1. A photovoltaic device for a solar panel, the device comprising:
a photovoltaic active material; and
a static interferometric stack comprising a plurality of distinct layers covering a first side of the photovoltaic active material, wherein the interferometric stack is configured to interferometrically reflect visible wavelengths to produce a dominant reflectance peak having a narrow band of enhanced reflections about the peak and relatively depressing all visible wavelengths outside the narrow band such that the dominant reflectance peak predominantly determines a color apparent to a viewer normal to the first side, wherein the plurality of distinct layers of the interferometric stack comprise an absorber and an optical resonant cavity.
2. The device of claim 1, wherein the photovoltaic active material comprises front electrode regions on a front side of the device, and window regions on the front side of the device adjacent the front electrode regions.

3. The device of claim 2, wherein a reflectivity of visible light reflected out of the interferometric stack in front of the window regions is greater than 10% relative to visible incident light.

4. The device of claim 2, wherein a reflectivity of visible light reflected out of the interferometric stack in front of the window regions is greater than 15% relative to visible incident light.

5. The device claim 1, wherein a peak reflectance at the dominant reflectance peak is between 20% and 95%.

6. The device of claim 1, wherein a peak reflectance at the dominant reflectance peak is greater than 80%.

7. The device of claim 1, wherein the first side is a light-incident side of the photovoltaic device and wherein the interferometric stack is configured to selectively transmit light through to the photovoltaic material such that the selectively transmitted light is converted to electrical current.

8. The device of claim 1, further comprising an additional film on a light-incident side of the interferometric stack.

9. The device of claim 8, wherein the additional film comprises a passivation or anti-reflection layer.

10. The device of claim 1, wherein the color apparent to the viewer normal to the first side is substantially uniform across the photovoltaic device.

11. The device of claim 1, wherein the photovoltaic device comprises a photovoltaic material selected from the group consisting of single crystal silicon, amorphous silicon, germanium, III-V semiconductors, copper indium gallium selenide, cadmium telluride, gallium arsenide, indium nitride, gallium nitride, boron arsenide, indium gallium nitride, and tandem multi junction photovoltaic materials.

12. The device of claim 1, wherein the interferometric stack further comprises a partial reflector such that the optical resonant cavity lies between the absorber and the partial reflector.

13. The device of claim 12, wherein the optical resonant cavity comprises an air gap having a height formed by supports separating the absorber from the partial reflector.

14. The device of claim 1, wherein the optical resonant cavity comprises a dielectric.

15. The device of claim 1, wherein the optical resonant cavity comprises a conductor.

16. The device of claim 1, wherein the optical resonant cavity comprises an optical thin film.

17. The device of claim 16, wherein the optical thin film has an index of refraction (n) between about 1 and 3.

18. The device of claim 17, wherein a thickness of the optical thin film is between about 42/n nm and 700/n nm.

19. The device of claim 16, wherein a height of the optical resonant cavity is not uniform across the device.

20. A photovoltaic device for a solar panel, the device comprising:
two or more regions, each region comprising:
a photovoltaic active material; and
a static interferometric stack comprising an absorber and an optical thin film defining an optical resonant cavity over the photovoltaic active material, the static interferometric stack covering a first side of the photovoltaic active material, wherein the interferometric stack is configured to interferometrically reflect visible wavelengths to produce a dominant reflectance peak having a narrow band of enhanced reflections about the peak and relatively depressing all visible wavelengths outside the narrow band such that the dominant reflectance peak predominantly determines a color apparent to a viewer normal to the first side;

wherein the optical thin films of the two or more regions are patterned such that each region has a different optical thin film height producing a different dominant reflectance peak predominantly determining a different color apparent to the viewer normal to the first side.

21. The device of claim 20, wherein the two or more regions comprise a regular array of static pixels.

22. The device of claim 21, wherein the array of static pixels comprises a plurality of red pixels, a plurality of green pixels, and a plurality of blue pixels.

23. A photovoltaic device for a solar panel, the device comprising:
a photovoltaic active layer; and
a static interferometric modulator over a first side of the photovoltaic active material, wherein the interferometric stack is configured to interferometrically tune reflections to produce a dominant reflectance peak having a narrow band of enhanced reflections about the peak and relatively depressing all visible wavelengths outside the narrow band such that the dominant reflectance peak predominantly determines a color apparent to a viewer normal to the first side, the interferometric modulator comprising:
one or more optically transparent layers forming an optical resonant cavity over the photovoltaic active layer; and
an absorber layer over the optical resonant cavity, wherein the optical resonant cavity has a thickness that is between about 10 nm to about 3000 nm and the absorber layer has a thickness that is between about 20 Å to about 300 Å.

24. The device of claim 23, wherein the interferometric modulator is positioned over the front side of the photovoltaic active layer.

25. The device of claim 24, wherein the interferometric modulator is configured to selectively transmit light through to the photovoltaic active layer for conversion to electrical current.

26. The device of claim 23, wherein the interferometric modulator is positioned over the back side of the photovoltaic active layer.

27. A photovoltaic device for a solar panel, the device comprising:
means for generating an electrical current from incident light having a first side; and
a thin film stack for interferometrically reflecting visible wavelengths to produce a dominant reflectance peak having a narrow band of enhanced reflections about the peak and relatively depressing all visible wavelengths outside the narrow band such that the dominant reflectance peak predominantly determines a color apparent to a viewer normal to the first side,
wherein the thin film stack includes an optical resonant cavity and an absorber over the first side of the means for generating the electrical current.

28. The device of claim 27, wherein the means for generating the electrical current comprises a semiconductor photovoltaic active material.

29. The device of claim 27, wherein the thin film stack further comprises a partial reflector between the optical resonant cavity and the means for generating an electrical current from incident light.

30. The device of claim 1, wherein a half-peak bandwidth of the dominant reflectance peak is equal to or less than approximately 150 nm.

31. The device of claim 1, wherein the photovoltaic cell comprises an interferometrically-enhanced photovoltaic cell.

* * * * *